United States Patent
Hongo

(10) Patent No.: US 8,004,327 B2
(45) Date of Patent: Aug. 23, 2011

(54) PHASE LOCKED OSCILLATOR AND RADAR UNIT HAVING THE SAME

(75) Inventor: Hironobu Hongo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/709,721

(22) Filed: Feb. 22, 2010

(65) Prior Publication Data

US 2010/0213993 A1      Aug. 26, 2010

Related U.S. Application Data

(63) Continuation of application No. PCT/JP2007/000922, filed on Aug. 28, 2007.

(51) Int. Cl.
    *H03L 7/06* (2006.01)
(52) U.S. Cl. .................................. 327/156; 327/147
(58) Field of Classification Search .............. 327/148, 327/157
    See application file for complete search history.

(56) References Cited

U.S. PATENT DOCUMENTS

| | | | |
|---|---|---|---|
| 7,091,759 B2 * | 8/2006 | Sowlati et al. ............... | 327/157 |
| 7,459,946 B2 * | 12/2008 | Bollenbeck et al. .......... | 327/116 |
| 7,521,974 B2 * | 4/2009 | Kirschenmann .............. | 327/156 |
| 2003/0016163 A1 | 1/2003 | Isaji | |
| 2003/0184470 A1 | 10/2003 | Ishii et al. | |
| 2004/0012447 A1 | 1/2004 | Nagaishi et al. | |
| 2005/0007271 A1 | 1/2005 | Isaji | |

FOREIGN PATENT DOCUMENTS

| | | |
|---|---|---|
| JP | 09312521 | 12/1997 |
| JP | 200328951 | 1/2003 |
| JP | 2003294835 | 10/2003 |
| JP | 200456172 | 2/2004 |

OTHER PUBLICATIONS

International Search Report dated Nov. 6, 2007, in corresponding International application No. PCT/JP2007/000922.

* cited by examiner

*Primary Examiner* — Hai L Nguyen
(74) *Attorney, Agent, or Firm* — Murphy & King, P.C.

(57) ABSTRACT

An error detecting unit of a phase-locked oscillator evaluates difference between a reference phase error signal output from a phase detector and a phase error signal actually output from the phase detector when a reference frequency modulation signal is output from a voltage-controlled oscillator and further detects a frequency error of the frequency modulation signal from the voltage-controlled oscillator based on a rate of change of the difference. A correction unit of the phase-locked oscillator calculates an average value of the frequency error in a predetermined section of the frequency modulation signal and corrects center frequency of the frequency modulation signal by correcting the average value to be zero, and changes the rate of change of control voltage per control step based on comparison between at least two frequency errors in one cycle of the frequency modulation signal. Thus frequency shift of the frequency modulation signal is corrected.

15 Claims, 39 Drawing Sheets

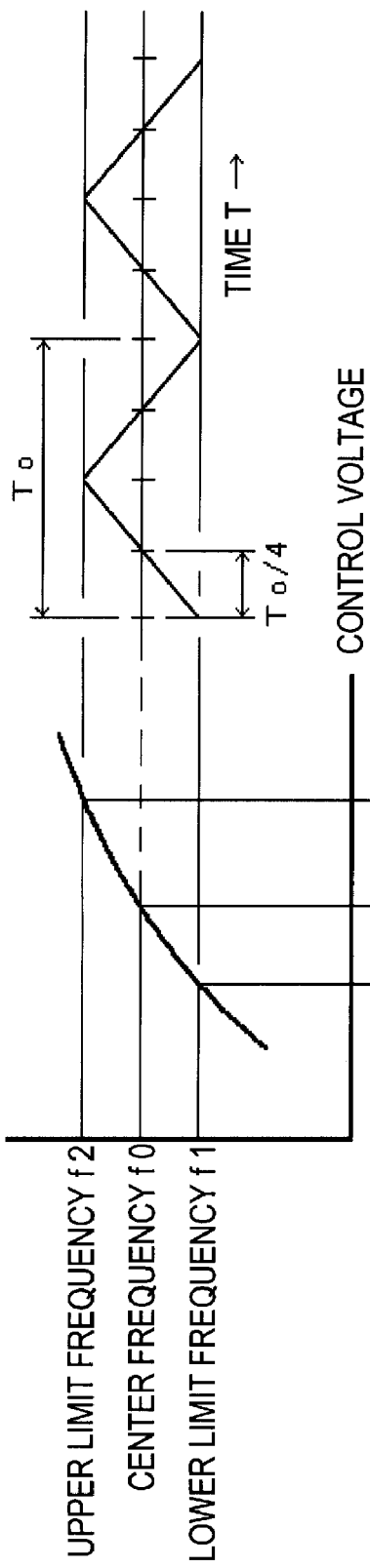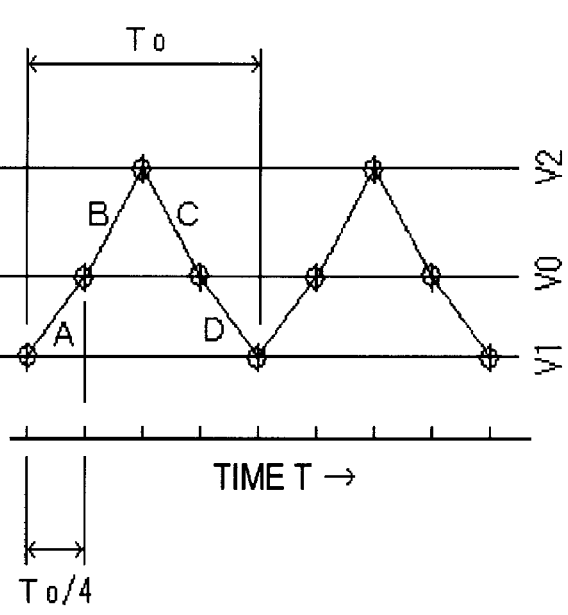

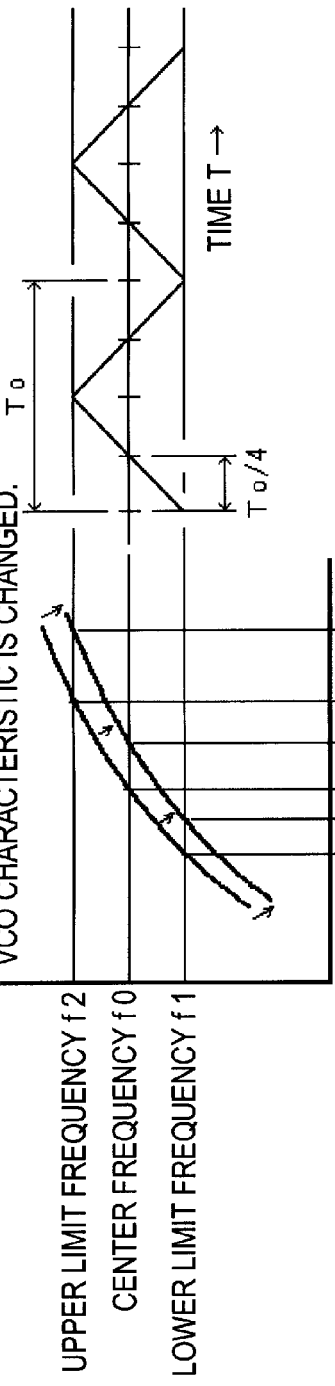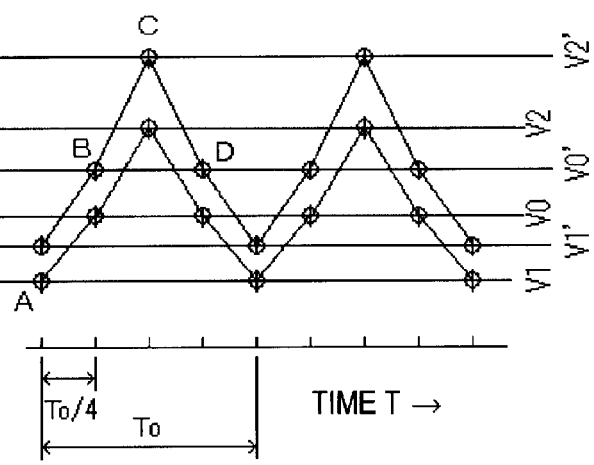

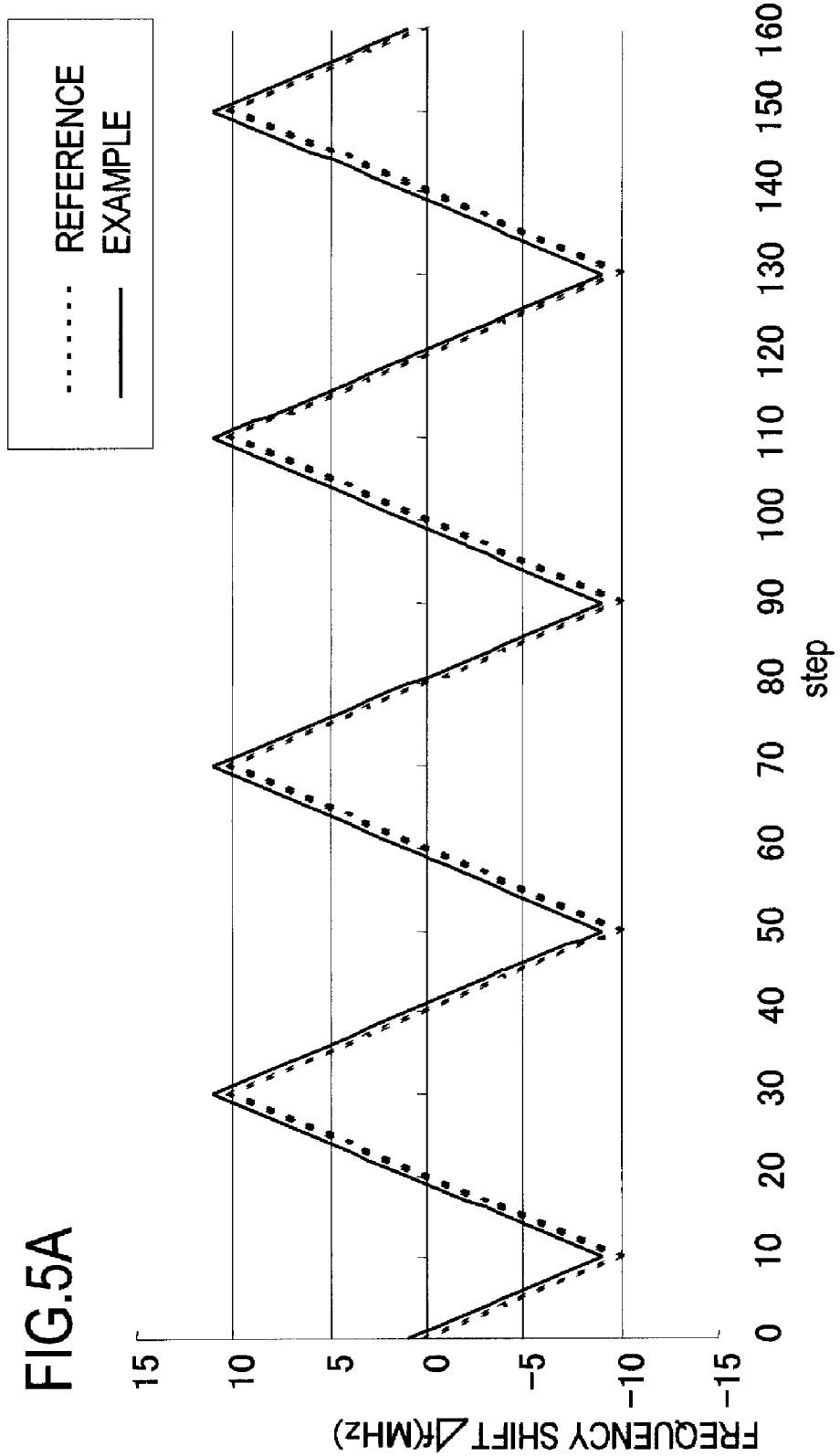

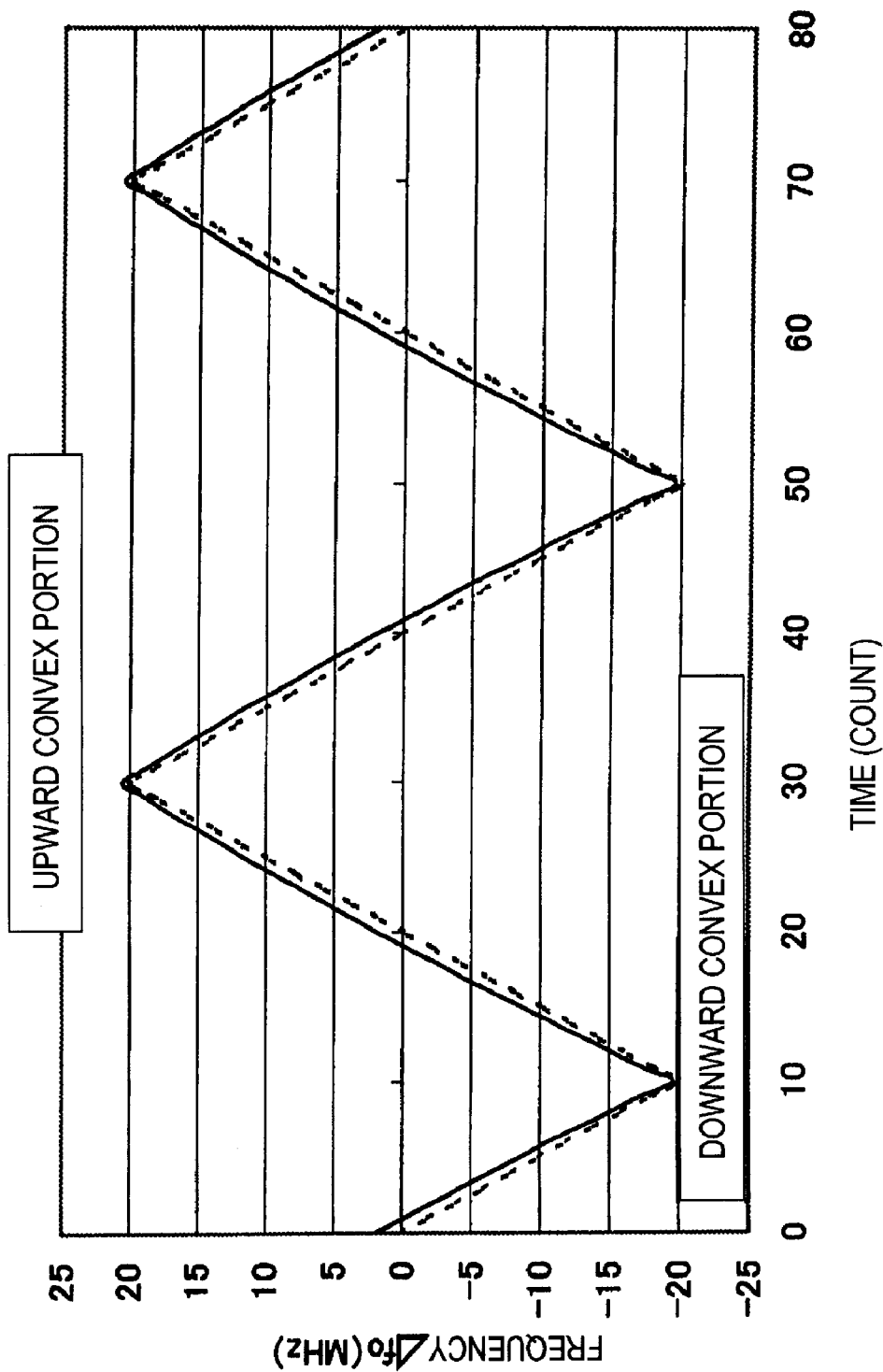

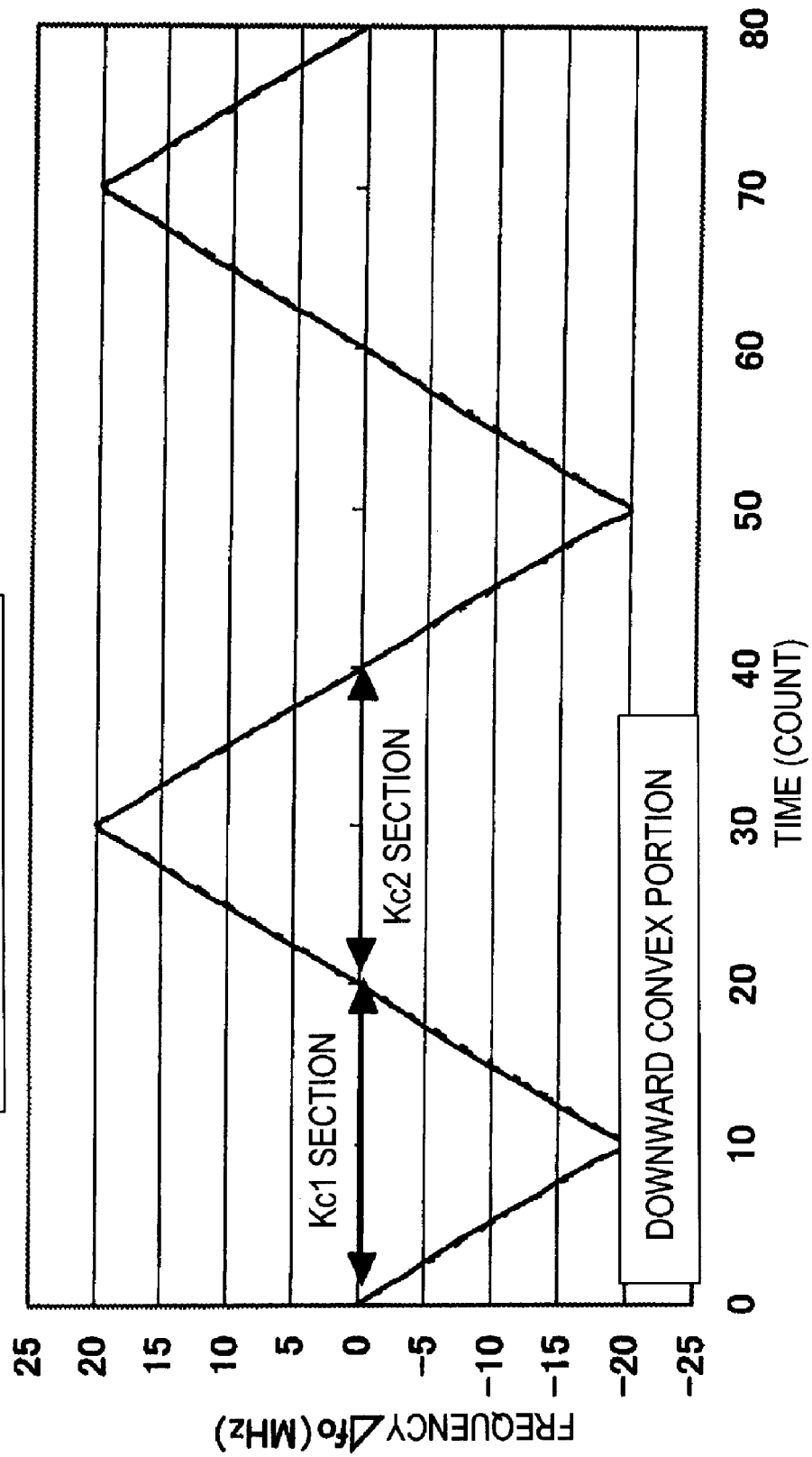

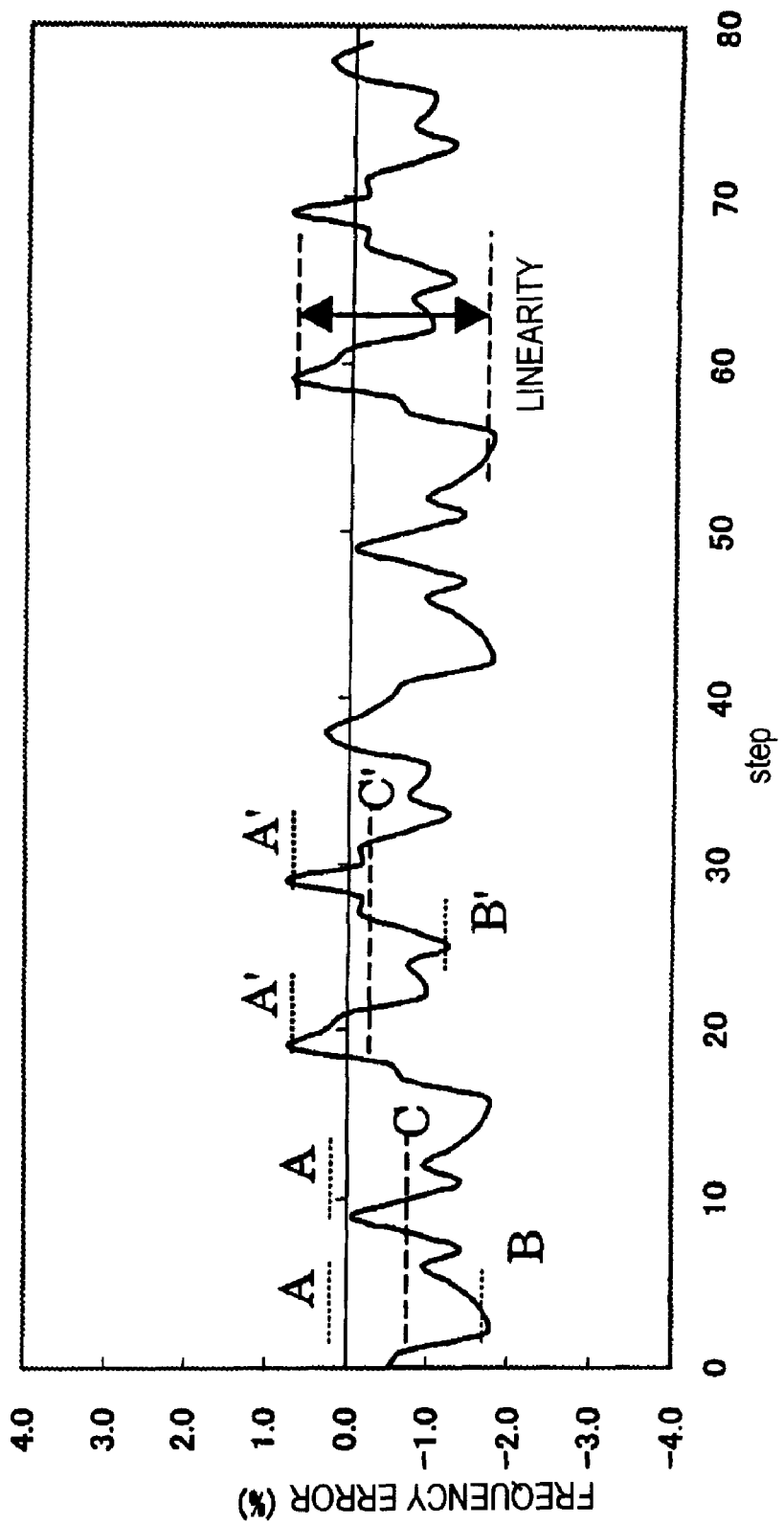

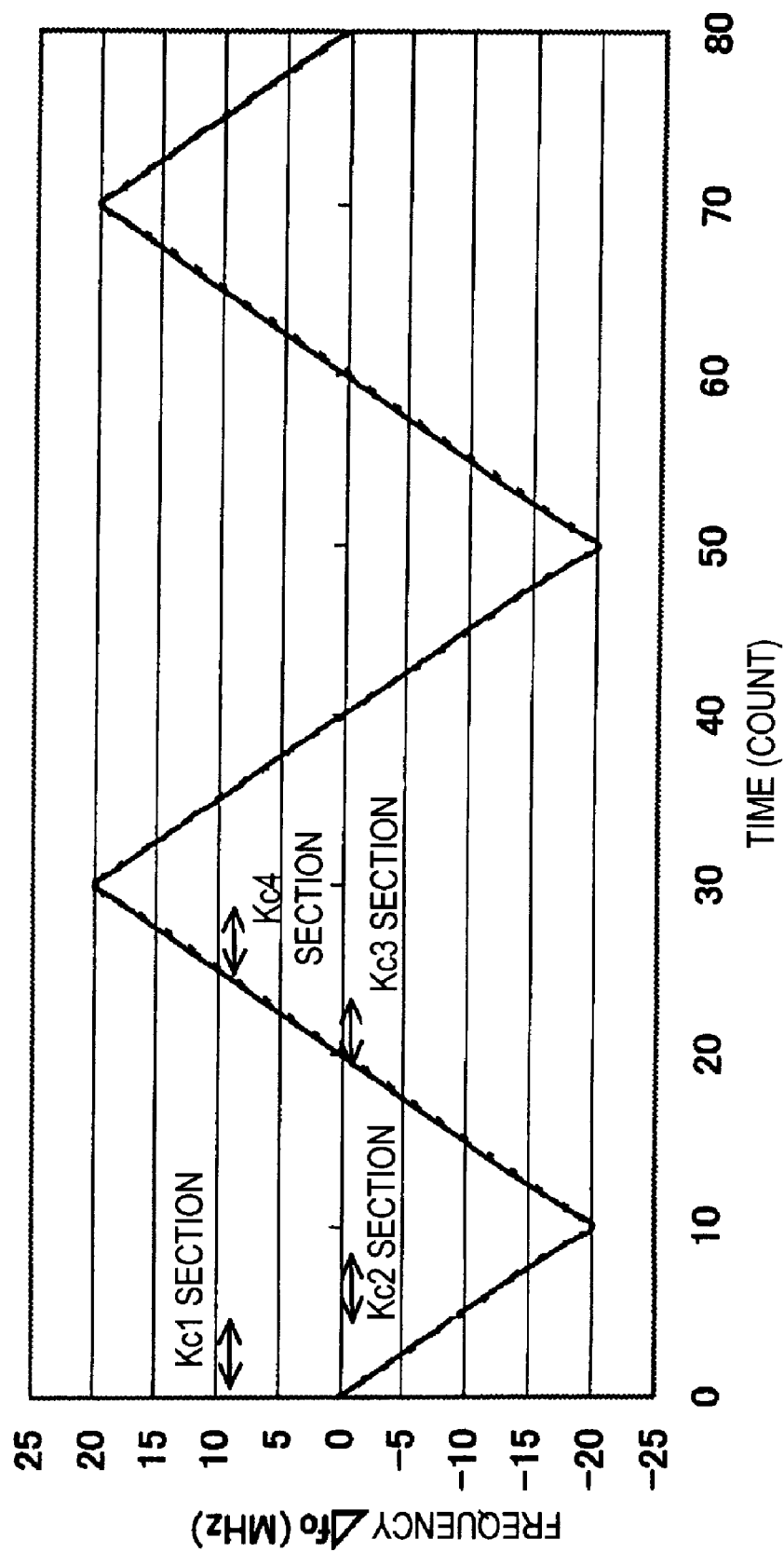

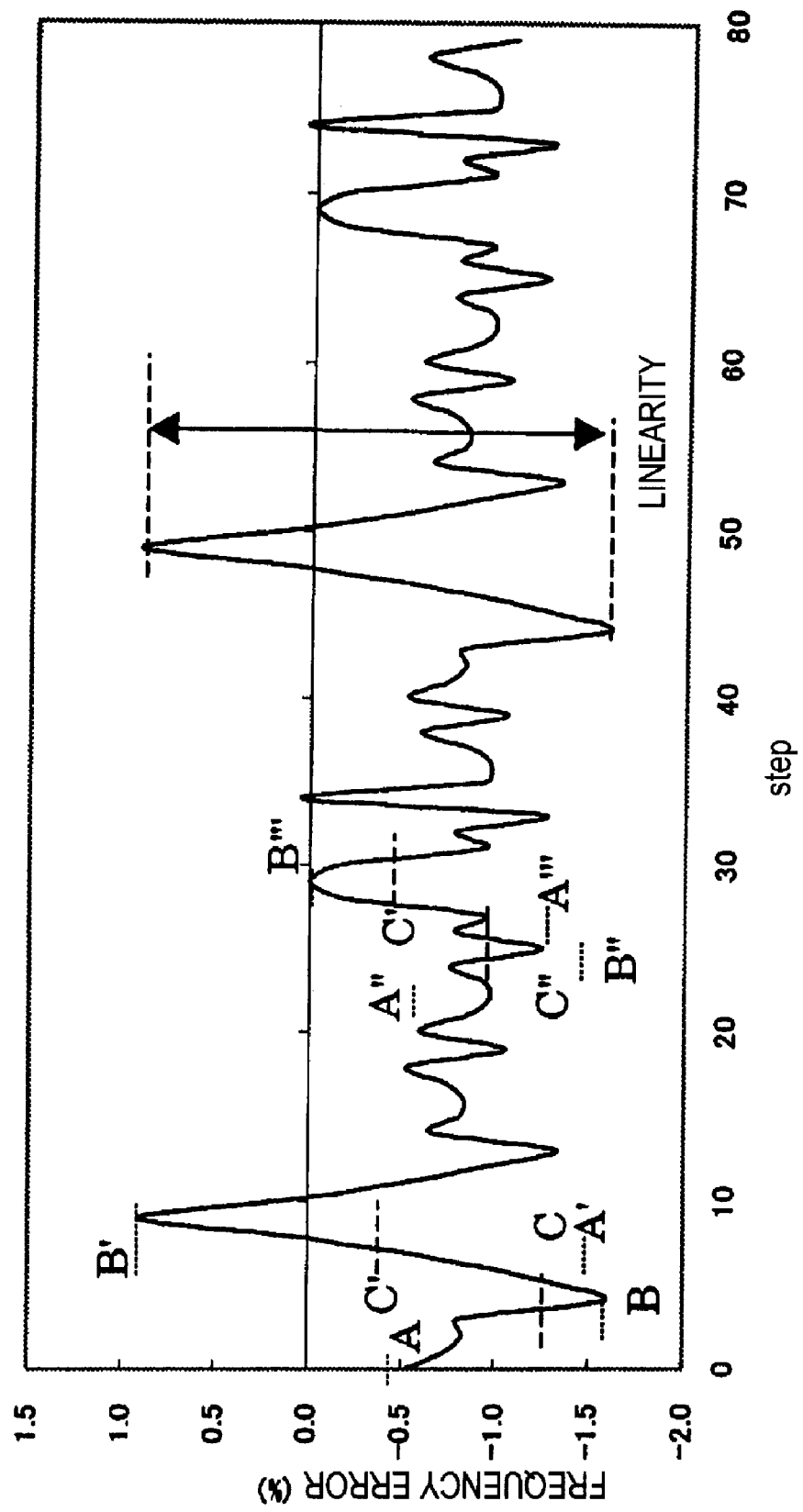

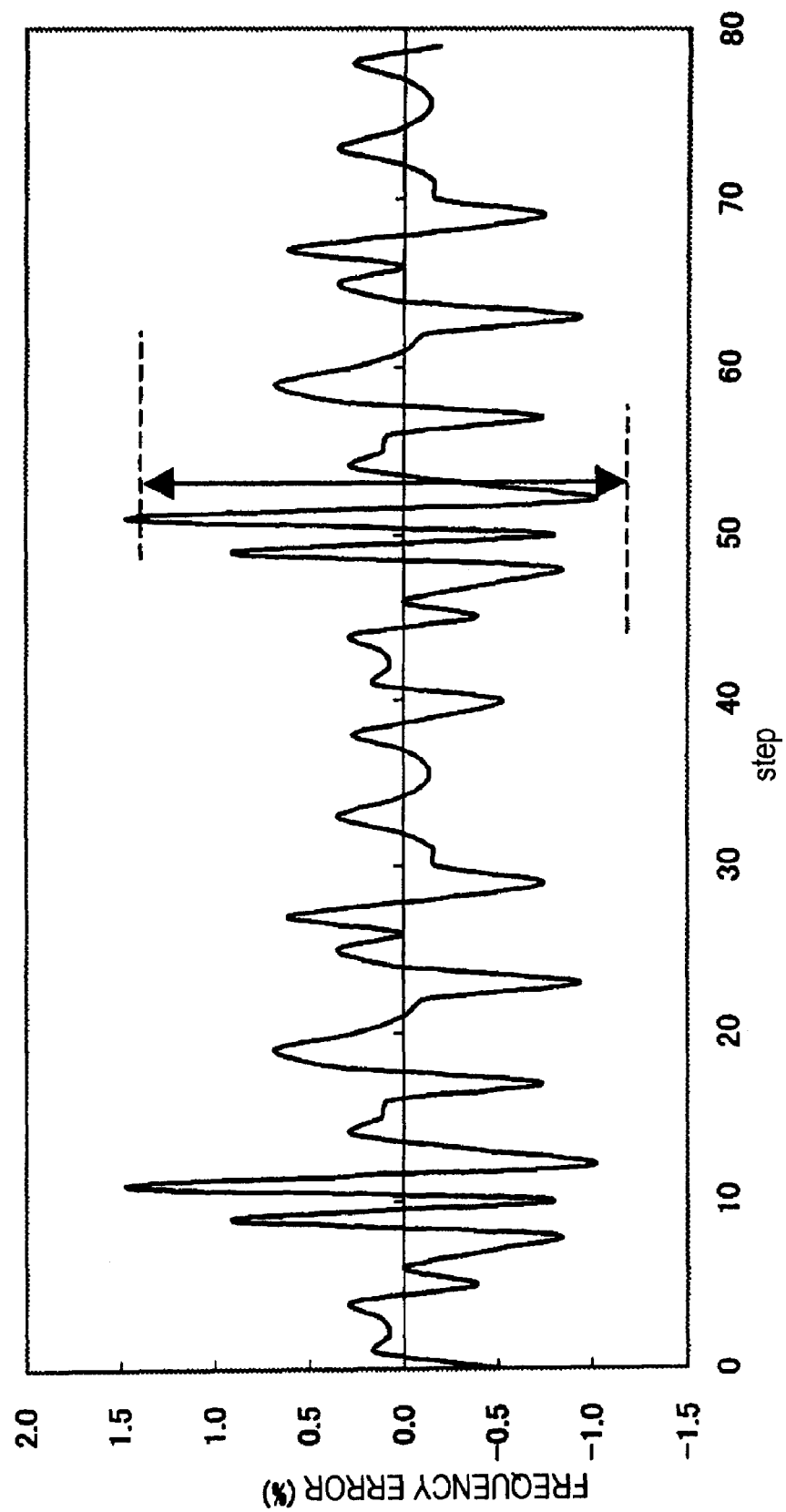

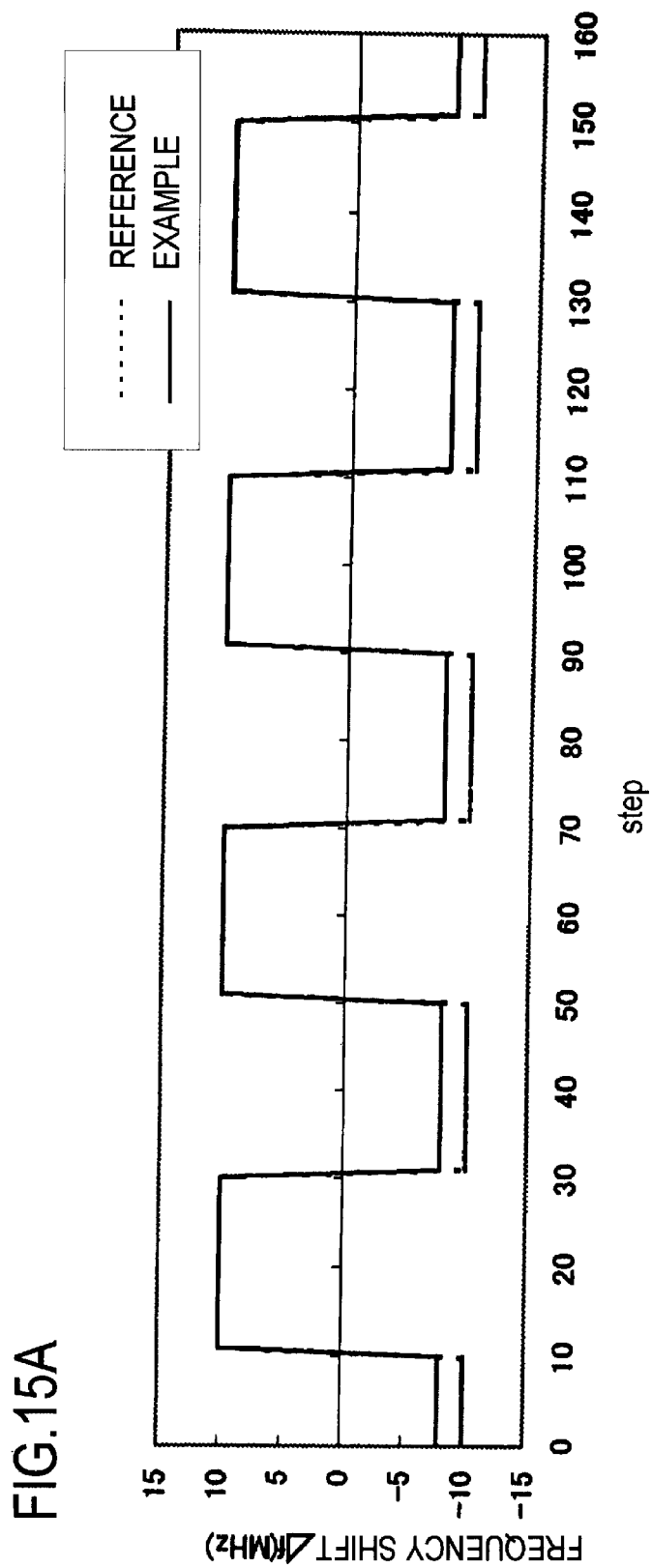

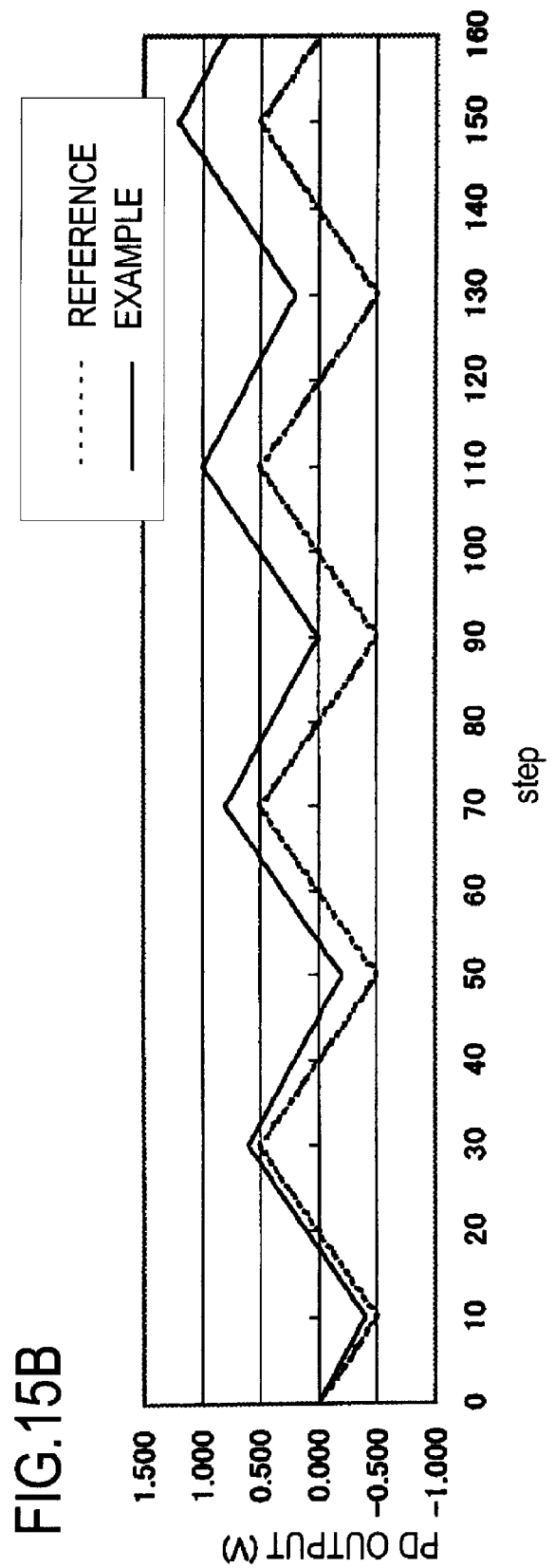

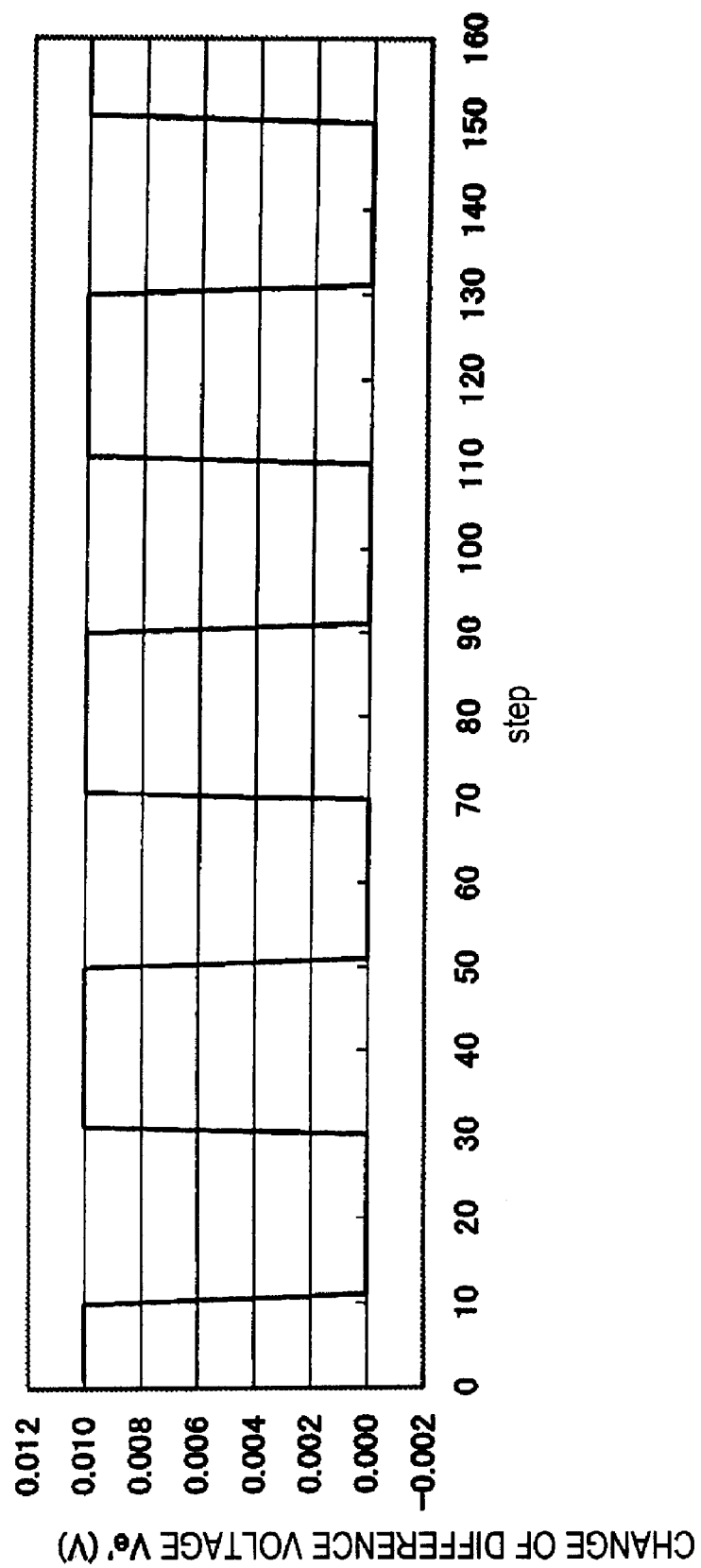

PHASE LOCKED OSCILLATOR AND RADAR UNIT HAVING THE SAME

CROSS REFERENCE TO RELATED APPLICATIONS

This application is a continuation of International Application No. PCT/JP2007/000922, filed on Aug. 28, 2007, now pending, herein incorporated by reference.

FIELD OF THE INVENTION

The present invention relates to a phase locked oscillator and a control method therefor, and more particularly a phase locked oscillator appropriate for a radar unit such as an FM-CW radar and a radar unit having the same.

BACKGROUND ART

An FM-CW (Frequency Modulated Continuous Wave) radar is mounted on, for example, an automobile, so as to be applied to such functions as collision prevention and inter-vehicle distance control.

FIG. 1 is a diagram illustrating a basic configuration of the FM-CW radar. A function generator FG in an oscillator unit generates a triangular-wave-shaped modulated signal (control signal) of, for example, 500 Hz, or of that order, so as to perform frequency modulation on a VCO with the above triangular wave. The frequency modulated signal output from the VCO is radiated from an antenna as a transmission signal. A signal reflected after being hit on a target is received by the antenna, and a beat signal is obtained by that a mixer mixes the reception signal with the transmission signal. By analyzing the beat signal, it is possible to obtain distance and relative speed to the target.

An important matter of the FM-CW radar is that a maximum and a minimum frequency shifts thereof should not be changed from the criterion of the center frequency of the frequency modulated signal, and that the frequency should be changed with time in a line shape (linearly). However, in general, a VCO frequency modulation characteristic is not linear.

FIGS. 2A-2C are diagrams illustrating a VCO frequency modulation characteristic. FIG. 2A is a diagram illustrating the VCO frequency modulation characteristic, in which an output frequency is not changed linearly relative to a control voltage. Therefore, as illustrated in FIG. 2B, in order to output an accurate triangular-wave-shaped frequency modulated signal having an oscillation frequency changed linearly, it is necessary to correct a gradient (change rate) of the triangular-wave-shaped control voltage, as illustrated in FIG. 2C. Specifically, in case of producing oscillation of a triangular wave that is linearly changed with center frequency f0, lower limit frequency f1 and upper limit frequency f2, the VCO frequency modulation characteristic can be corrected by changing, for example, the gradient between a control voltage V0 corresponding to the center frequency f0 and a control voltage V1 corresponding to the lower limit frequency f1 (sections A, D) and the gradient between the center frequency f0 and the upper limit frequency f2 (sections B, C), as illustrated in FIG. 2C.

As a linearity calibration unit for linearly changing the output frequency, conventionally, it is known to generate and store a correction data relative to the VCO frequency modulation characteristic at the time of factory shipment, and to correct the control voltage using the correction data. Also, it is a known method to detect the VCO frequency modulation characteristic by using a received signal from a target (Patent document 1).

Further, in addition to having no linear characteristic, the VCO frequency modulation characteristic is changed due to temperature change and secular change.

FIGS. 3A-3C are diagrams illustrating the change of a VCO frequency modulation characteristic. As illustrated in FIG. 3A, when the VCO frequency modulation characteristic is changed due to temperature change and secular change, in order to output a frequency modulated signal [FIG. 3B] having frequency characteristics (center frequency and frequency shift) which are identical before and after the change, it is necessary to correct the control voltage according to the above change, as illustrated in FIG. 3C.

In order to cope with temperature change, it is necessary to generate in advance the correction data of the control voltage on a temperature-by-temperature basis, which requires a vast amount of data, and a temperature sensor as well. Moreover, correction accuracy stays low. Further, in regard to secular change, it is not possible to cope with it by a method of storing the correction data, and accordingly, it is not possible to detect the change of the frequency modulation characteristic in real time.

[Patent document 1] Japanese Laid-open Patent Publication No. 2003-28951.

DISCLOSURE OF THE INVENTION

Problems to be Solved by the Invention

Accordingly, an objective of the present invention is to provide a phase locked oscillator capable of continuously obtaining a highly stable VCO output with a simple structure and control, irrespective of the variation of a VCO frequency modulation characteristic due to temperature change and secular change, and to provide a radar unit having the same.

Another objective of the present invention is to provide a phase locked oscillator enabling linearity calibration, by detecting a change of a VCO frequency modulation characteristic real time even during radar operation, and by correcting a frequency modulation characteristic real time according to the above change, and a radar unit having the same.

SUMMARY OF THE INVENTION

A first configuration of a phase locked oscillator of the invention to attain the above objects is a phase locked oscillator having a PLL loop which includes: a first phase detector comparing between phases of a reference signal and a first comparison signal, and outputting a phase error signal corresponding to a phase difference; a first low pass filter cutting off an alternating current component of the phase error signal of the first phase detector; a control unit controlling a control voltage according to an output signal from the first low pass filter, and outputting the control voltage for each predetermined control step; a voltage controlled oscillator generating a frequency modulated signal having a frequency changing from a predetermined center frequency by a predetermined frequency shift amount at a predetermined period according to the control voltage; and a first variable frequency divider forming the first comparison signal by frequency dividing the frequency modulated signal of the voltage control led oscillator, the control unit further including: an error detection unit for detecting a frequency error of the frequency modulated signal for each control step relative to a reference frequency modulated signal modulated with a preset reference center frequency and a reference frequency shift based on the phase error signal; and a correction unit for correcting the control voltage based on the detected frequency error.

A second configuration of a phase locked oscillator of the invention is the phase locked oscillator of the first configuration, characterized in that the error detection unit obtains a difference between a reference phase error signal being output from the phase detector when the reference frequency modulated signal is output from the voltage controlled oscillator and the phase error signal actually output from the phase detector, and further detects the frequency error of the frequency modulated signal based on a change rate of the difference.

A third configuration of a phase locked oscillator of the invention is the phase locked oscillator of the second configuration, characterized in that the correction unit calculates an average value of the frequency errors in a predetermined section of the frequency modulated signal, and corrects a control voltage in such a manner that the average value becomes a predetermined offset value.

A fourth configuration of a phase locked oscillator of the invention is the phase locked oscillator of the third configuration, characterized in that the correction unit corrects the center frequency of the frequency modulated signal by setting the offset value to be zero.

A fifth configuration of a phase locked oscillator of the invention is the phase locked oscillator of the third configuration, characterized in that the correction unit allows the center frequency of the frequency modulated signal to change without changing the number of frequency divisions of the variable divider, by setting the offset value to be a predetermined value other than zero.

A sixth configuration of a phase locked oscillator of the invention is the phase locked oscillator of the second configuration, characterized in that the correction unit corrects the frequency shift of the frequency modulated signal by changing the change rate of the control voltage for each control step, based on the comparison of at least two frequency errors in one period of the frequency modulated signal.

A seventh configuration of a phase locked oscillator of the invention is the phase locked oscillator of the sixth configuration, characterized in that the correction unit allows the change rate of the control voltage for each control step to change in such a manner that an average value of a maximum value and a minimum value of the frequency errors in a first section in one period of the frequency modulated signal becomes equal to an average value of a maximum value and a minimum value of the frequency errors in a second section.

An eighth configuration of a phase locked oscillator of the invention is the phase locked oscillator of the sixth configuration, characterized in that the correction unit allows the change rate of the control voltage for each control step in the first section to change in such a manner that predetermined two frequency errors included in the first section in one period of the frequency modulated signal become equal, and allows the change rate of the control voltage for each control step in the second section to change in such a manner that predetermined two frequency errors included in the second section in one period of the frequency modulated signal become equal.

A ninth configuration of a phase locked oscillator is the phase locked oscillator of the sixth configuration, characterized in that the correction unit allows a control voltage being output according to the change rate of the control voltage for each control step to change on the basis of each control step, based on the frequency error of the frequency modulated signal for each control step.

A tenth configuration of a phase locked oscillator is the phase locked oscillator of the second configuration, characterized in that the correction unit calculates a correction value of the control voltage corresponding to the frequency error, according to modulation sensitivity of the voltage controlled oscillator corresponding to the frequency change rate of the frequency modulated signal corresponding to the change rate of the control voltage, and corrects the control voltage using the correction value.

An eleventh configuration of a phase locked oscillator of the invention is the phase locked oscillator of the second configuration, characterized in that the control unit further decides whether the frequency error exceeds a predetermined tolerable range, and in case of an excess, includes an alarm unit for suspending outputting the frequency modulated signal from the voltage controlled oscillator.

A twelfth configuration of a phase locked oscillator of the invention is the phase locked oscillator of the first configuration, further having: a second low pass filter passing a frequency component in the phase error signal corresponding to the predetermined period of the frequency modulated signal, characterized in that an output signal of the second low pass filter is input to the control unit, and the error detection unit detects the frequency error based on the output signal of the second low pass filter.

A thirteenth configuration of a phase locked oscillator the invention is the phase locked oscillator of the first configuration, further having: a second phase detector comparing between phases of the reference signal and a second comparison signal, and outputting a phase error signal according to a phase difference; a second variable frequency divider forming the second comparison signal by frequency dividing the frequency modulated signal of the voltage controlled oscillator by the number of frequency divisions different from the number of frequency divisions of the first variable frequency divider; and a second low pass filter passing a frequency component in the phase error signal from the second phase detector, corresponding to the predetermined period of the frequency modulated signal, characterized in that an output signal of the second low pass filter is input to the control unit, and the error detection unit detects the frequency error based on the output signal of the second low pass filter.

A radar unit of the invention includes the phase locked oscillator in either one of configurations 1 through 13. Further, it is preferable that the radar unit is an FM-CW radar or a two-frequency CW radar.

Effect of the Invention

According to the present invention, it is possible to detect a change of a frequency modulation characteristic during radar operation without suspending the radar operation, and to correct a frequency error according to the above change real time, which enables real-time linearity calibration during radar operation.

BRIEF DESCRIPTION OF DRAWINGS

FIGS. 2A-2C are diagrams illustrating a VCO frequency modulation characteristic.

FIGS. 3A-3C are diagrams illustrating the change of a VCO frequency modulation characteristic.

FIG. 5A is a diagram describing an example (example 1) in a case of calculating frequency shift error of the VCO output frequency relative to the reference.

FIG. 8B is a diagram describing a first correction method for correcting the center frequency error and the frequency shift error.

FIG. 9B is a diagram describing a second correction method for correcting the center frequency error and the frequency shift error.

FIG. 9C is a diagram describing a second correction method for correcting the center frequency error and the frequency shift error.

FIG. 10B is a diagram describing a third correction method for correcting the center frequency error and the frequency shift error.

FIG. 10C is a diagram describing a third correction method for correcting the center frequency error and the frequency shift error.

FIG. 11C is a diagram describing a fourth correction method for correcting the center frequency error and the frequency shift error.

FIG. 15A is a diagram describing an example (example 4) in a case of calculating central frequency error and frequency shift error of the VCO output frequency in a two-frequency CW radar.

FIG. 15B is a diagram describing an example (example 4) in a case of calculating central frequency error and frequency shift error of the VCO output frequency in a two-frequency CW radar.

FIG. 15D is a diagram describing an example (example 4) in a case of calculating central frequency error and frequency shift error of the VCO output frequency in a two-frequency CW radar.

EXPLANATION OF SYMBOLS

Figure 1:
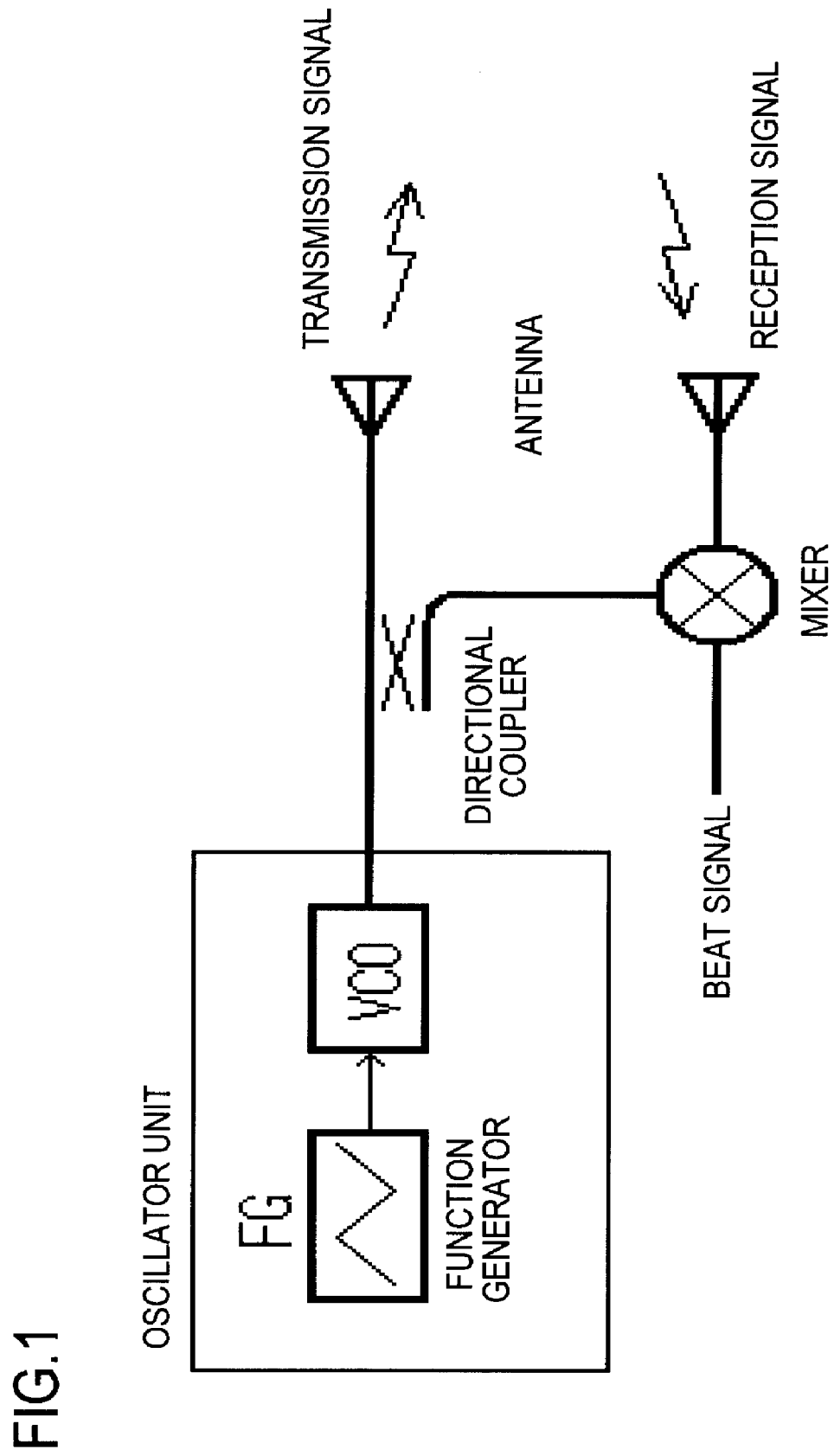
FIG. 1 is a diagram illustrating a basic configuration of the FM-CW radar.

10: Clock oscillator, 20: Phase comparator unit, 21: Frequency divider, 22: Frequency divider, 23: Phase detector (PD), 31: LPF, 32: OPF, 40: Processor unit (PU), 41: A/D, 42: A/D, 43: CPU, 44: D/A, 50: Voltage-controlled oscillator, 60: RF switch

DESCRIPTION OF EMBODIMENTS OF THE INVENTION

Embodiments of the present invention will now be described with reference to the drawings. The technical scope of the present invention, however, shall not be limited to these embodiment, but extend to matters stated in the Claims and equivalents thereof.

At an arbitrary time after the start of operation of an FM-CW radar, a VCO frequency modulation characteristic which may be changed due to temperature change and secular change is obtained, and corresponding thereto, linearity calibration of a VCO output frequency is performed. The principle of a linearity calibration method is, when it is mentioned directly, to lock a phase locked oscillator (PLL) at each of center frequency f0, lower limit frequency f1 and upper limit frequency f2 of an output frequency at an arbitrary time, and to measure control voltages V0, V1, V2 corresponding to the respective frequencies. Even when the frequency modulation characteristic is changed, it is possible to detect a change in the frequency modulation characteristic by directly measuring the control voltages corresponding to the center frequency etc. Then, by the acquisition of a frequency change rate (modulation sensitivity) between the measured control voltages of the respective frequencies (for example, linear approximation), a control voltage corresponding to a frequency between the measured frequencies is obtained using the above frequency change rate. Thus, the linearity calibration of the output frequency is achieved. According to the above method, the finer the frequency intervals to be measured are made, the more the accuracy of the frequency change rate is improved, by which the change of the output frequency can be made more linear.

The aforementioned linearity calibration method is executable at an arbitrary time, and however, it is necessary to stop the radar operation at the time of the execution. Since the radar operation cannot be stopped while the automobile is running, it is assumed to execute, for example, before the start of radar operation immediately after the engine is started.

However, while the automobile is running, the radar unit itself is exposed in an environment having vibration and temperature change, which is an environment possibly causing a continuous change of the VCO frequency modulation characteristic. Therefore, although the linearity calibration is executed before the automobile starts running, there is a possible risk of causing a measurement error and malfunction of the radar operation if the frequency modulation characteristic is changed during the running.

Now, hereafter, there is described a configuration of a phase locked oscillator, enabling linearity calibration by detecting a change of the frequency modulation characteristic real time, and in response to the above change, correcting the frequency modulation characteristic real time.

Figure 4:
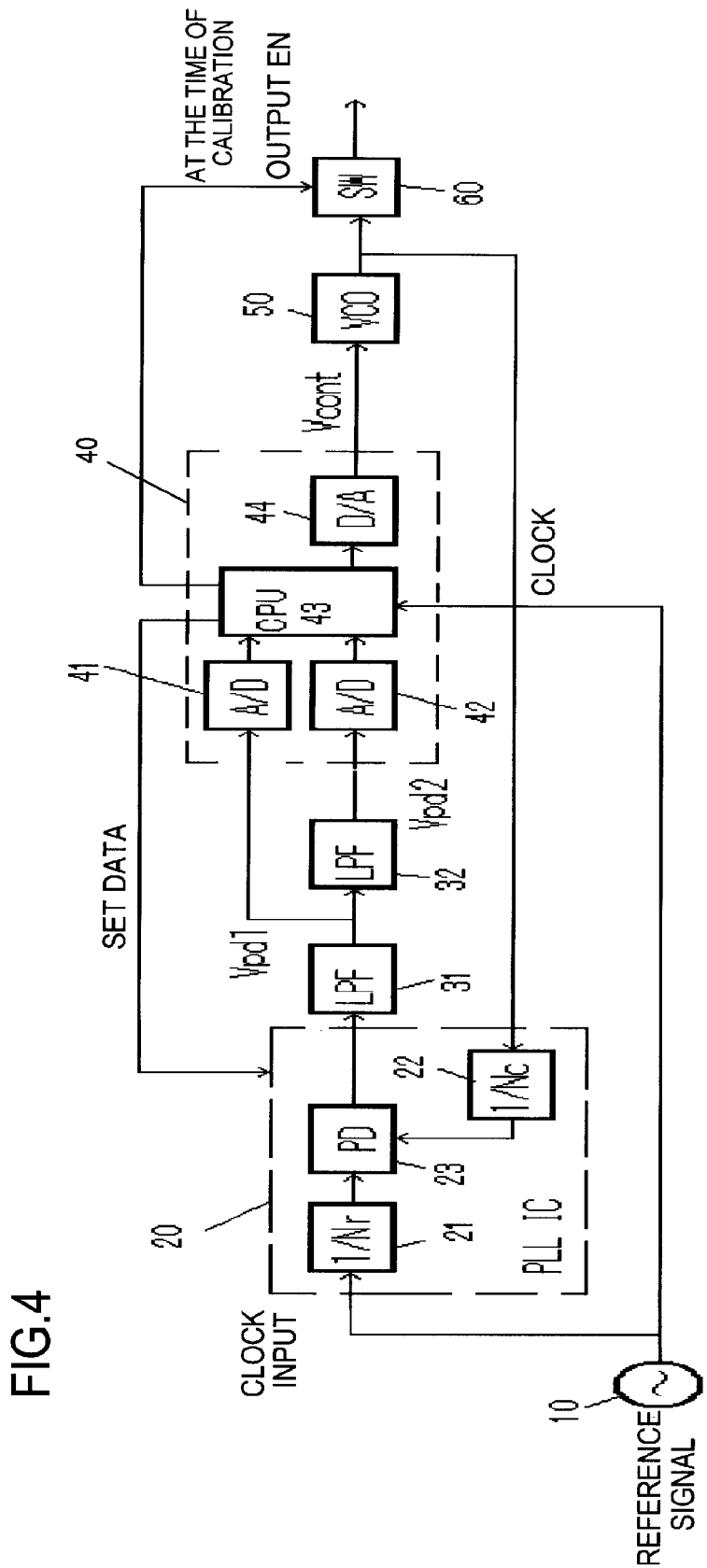
FIG. 4 is a diagram illustrating a first exemplary configuration of a phase locked oscillator according to an embodiment of the present invention.

FIG. 4 is a diagram illustrating a first exemplary configuration of a phase locked oscillator according to an embodiment of the present invention. In FIG. 4, a clock oscillator 10 generates a PLL reference clock signal CK. A phase comparator unit 20 includes a frequency divider (1/Nr) 21 for frequency dividing the clock signal CK, a frequency divider (1/Nc) 22 for frequency dividing a VCO output, and a phase detector (PD) 23 for comparing a reference signal from the frequency divider 21 with a comparison signal from the frequency divider 22 and for outputting a voltage signal (phase error signal) corresponding to the phase error obtained therefrom.

A low pass filter (LPF) 31 is a low pass filter for cutting a high-frequency component, which is higher than a frequency corresponding to the period of a triangular wave, from the phase error signal output from the phase detector 23, and for passing the frequency component of the triangular wave. A low pass filter (LPF) 32, which is connected to the subsequent stage to the low pass filter (LPF) 31, is a low pass filter (LPF) for cutting even the frequency component of the triangular wave (cutting an alternating current component), and for integrating a phase error signal.

A processor unit (PU) 40 corresponds to a control unit of the present invention, in which an A/D converter 41 samples a phase error signal Vpd1 being output from LPF 31, and an A/D converter 42 samples a phase error signal Vpd2 being output from LPF 32.

Based on the phase error signal Vpd2 from LPF 32, a CPU 43 generates a control voltage to be supplied to a voltage-controlled oscillator (hereafter simply referred to as VCO) 50. A D/A converter 44 converts the control voltage being output from CPU 43 into an analog control voltage Vc. VCO 50 outputs an oscillation signal having a frequency corresponding to the control voltage Vc. An RF switch (SW) 60 is a switch for passing/intercepting the output of VCO 50.

Additionally, before the start of radar operation, by means of the aforementioned linearity calibration method, the control voltages corresponding to the center frequency, the lower limit frequency and the upper limit frequency in triangular wave modulation are measured. Further, a frequency change rate (modulation sensitivity) between each frequency of the control voltages are obtained in advance. While the radar is in operation, the control voltage generated by CPU 43 is generated on the basis of the above measured control voltages and the modulation sensitivities.

Further, according to the present invention, CPU 43 detects a change of the frequency modulation characteristic of VCO 50 real time during the radar operation, based on the phase error signal Vpd1 from LPF 31, as will be described later. By the correction of the control voltage on a step-by-step basis at appropriate times based on the above change, real-time linearity calibration is achieved.

First, the principle for detecting the change of the VCO frequency modulation characteristic will be described. According to the present invention, frequency errors (center frequency error and frequency shift error) of a VCO output frequency produced due to the change of the VCO frequency modulation characteristic are detected. The detection is carried out by CPU 43. Hereafter, descriptions will be given in regard to an example of calculating the center frequency error of the VCO output frequency relative to a criterion (example 1), an example of calculating the frequency shift error of the VCO output frequency relative to a criterion (example 2), and an example of calculating both the center frequency error and the frequency shift error of the VCO output frequency relative to a criterion (example 3) in the above order.

Figure 5B:
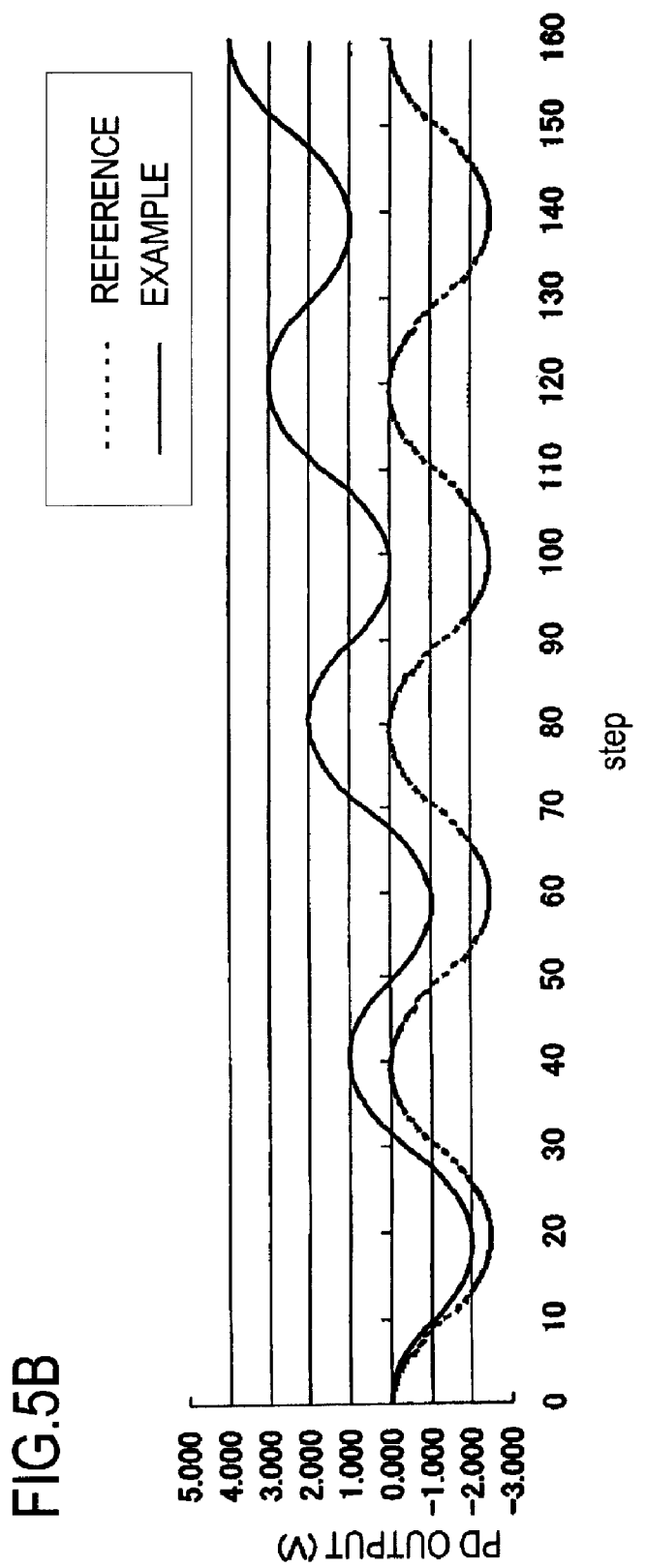
FIG. 5B is a diagram describing an example (example 1) in a case of calculating frequency shift error of the VCO output frequency relative to the reference.

FIGS. 5A-5E are diagrams describing the example 1. As illustrated in FIG. 5A, the example 1 is a case that the center frequency of the VCO output frequency is 1.0 MHz higher in comparison with the criterion, while the frequency shift is 10 MHz, which is equal to the criterion. Here, there will be described a method for deriving through calculation that the center frequency of the output frequency is 1.0 MHz higher and that no error occurs in the frequency shift.

The criterions described above are a center frequency and a frequency shift which are preset. For example, assuming that a VCO oscillation frequency (center frequency) is 2.5 GHz, a frequency shift is 10 MHz and a triangular wave frequency is 100 Hz, a reference output frequency has a waveform illustrated by the dotted line in FIG. 5A. In contrast, a waveform having the center frequency, which is 1.0 MHz higher than the reference output frequency (without frequency shift error), is illustrated by the solid line in FIG. 5A.

A phase detector outputs a change of the phase of a triangular-wave modulated comparison frequency (VCO output frequency) relative to the reference frequency. The reference frequency is a signal obtained by frequency dividing a reference signal generated by the clock oscillator. On the assumption that the above divided frequency is on the order of, for example, 20 kHz, the center frequency of the VCO output frequency is also frequency divided into a frequency of the order of 20 kHz, so as to be phase compared. Because the comparison frequency is triangular-wave modulated, the phase detector outputs an error voltage signal having a sine wave shape, as illustrated in FIG. 5B. The waveform illustrated by the dotted line in FIG. 5B is the error voltage signal of the phase detector when the VCO output frequency is identical to the criterion, while the waveform illustrated by the solid line in FIG. 5B is the error voltage signal of the phase detector when the center frequency of the output frequency is 1.0 MHz higher in comparison with the criterion (without a frequency shift error). Specifically, when the center frequency of the output frequency is 1.0 MHz higher in comparison with the criterion (without frequency shift error), a phase difference between with the reference frequency spreads. Accordingly, the output value becomes gradually increasing with a change in a sine wave shape, and in comparison with the output value when the center frequency is identical to the criterion, the difference therebetween becomes increasing.

Figure 5C:
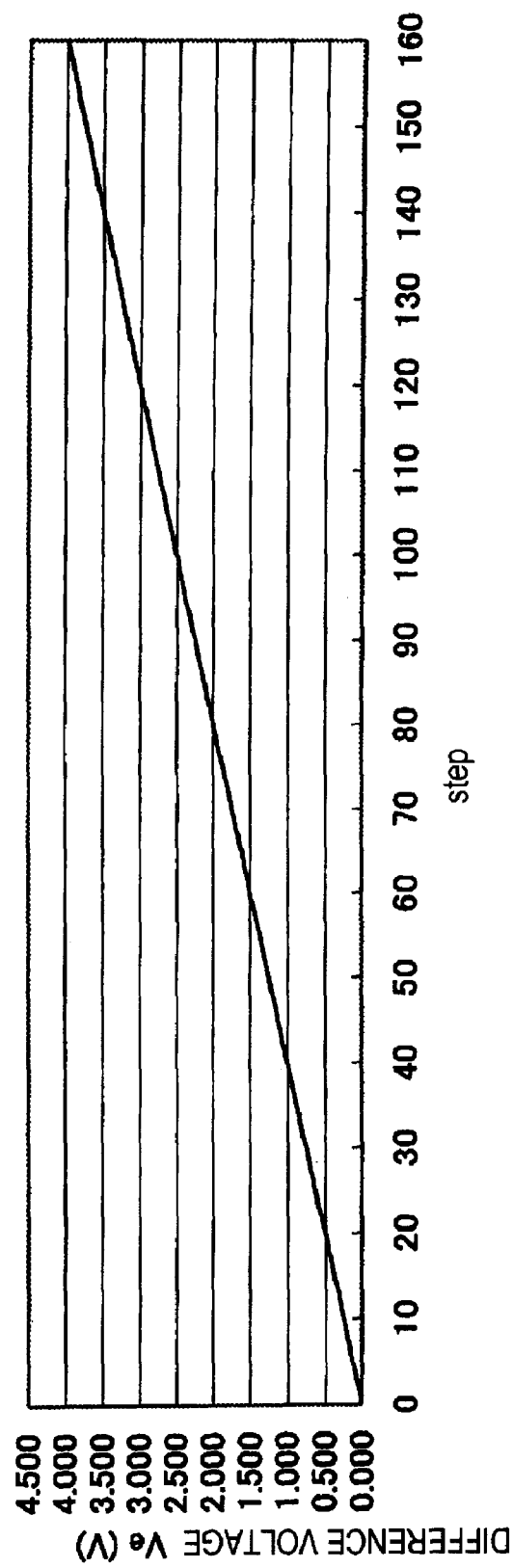
FIG. 5C is a diagram describing an example (example 1) in a case of calculating frequency shift error of the VCO output frequency relative to the reference.

FIG. 5C illustrates a difference between the waveforms illustrated by the dotted line and the solid line in FIG. 5B, representing a difference of the error voltage signal from the criterion when the center frequency of the VCO output frequency is 1.0 MHz higher in comparison with the criterion (without frequency shift error). From FIG. 5C, it is understood that the phase difference becomes spreading in a linear shape.

Figure 5D:
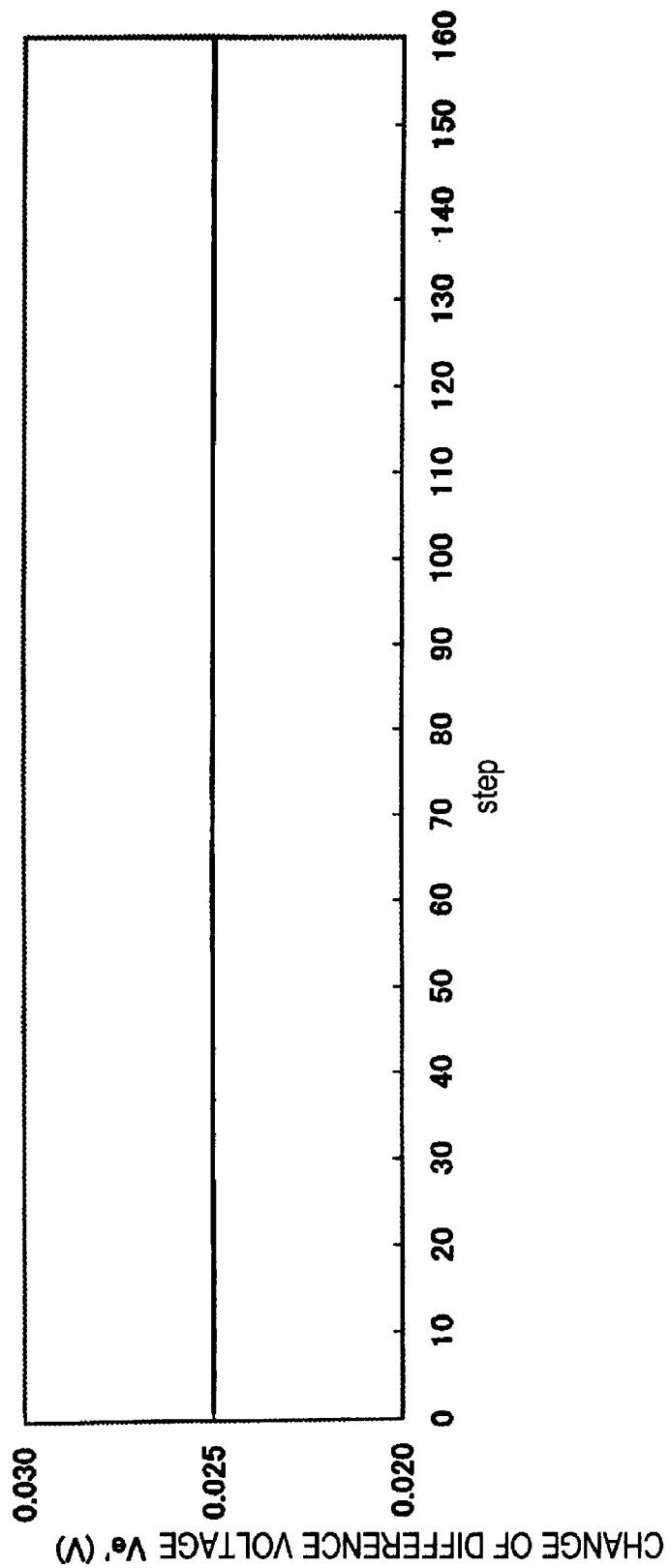
FIG. 5D is a diagram describing an example (example 1) in a case of calculating frequency shift error of the VCO output frequency relative to the reference.

FIG. 5D illustrates the differentiation result of the difference values obtained in FIG. 5C. Typically, a minute section $\Delta t$ is defined for the resolution of the triangular wave (which is counted on the basis of, for example, 40 steps per 100 Hz), and a change (differentiated value) $Ve'(n)$ of the error voltage (Ve) is obtained.

$Ve'(n)=Ve(n)-Ve'(n-1)$ (n is a step number)

is calculated. In the case of the example 1, because the phase difference is linearly changing (FIG. 5C), the change (differentiated value) of the error voltage becomes constant.

After obtaining the change (differentiated value) of the error voltage, next, the obtained differentiated value is converted into a frequency change $\Delta f(n)$ by use of a sensitivity Kd (V/Hz) of the phase detector.

$\Delta f(n)=(Ve'(n)/Kd)/\Delta t$ (n is a step number)

Figure 5E:
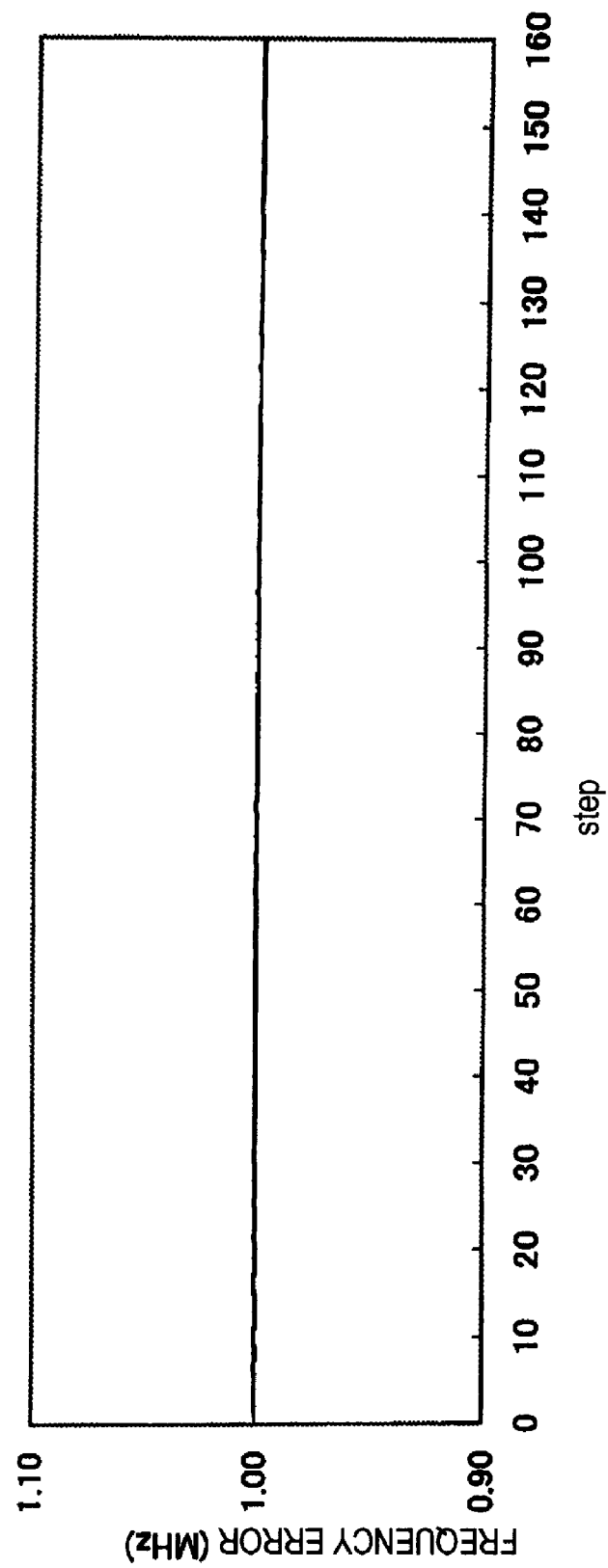
FIG. 5E is a diagram describing an example (example 1) in a case of calculating frequency shift error of the VCO output frequency relative to the reference.

FIG. 5E illustrates a frequency change calculated by the above expression in the case of the example 1. By that the VCO output frequency deviates by +1 MHz in comparison with the criterion in any step, it is understood that the center frequency deviates by +1 MHz, and that there is no error in the frequency shift. As such, by comparing the output (FIG. 5B) of the phase detector with the criterion, and by obtaining the difference therebetween, it is possible to detect the center frequency error from the differentiation result of the above difference.

By dividing the frequency change illustrated in FIG. 5E by the modulation sensitivity Kv (Kv=10 MHz/V, for example), it is possible to obtain a control voltage correction amount $\Delta V cont$ corresponding to the frequency change. Namely, the control voltage correction amount $\Delta V cont$ in each step is $\Delta V cont=\Delta f(n)/Kv$ (n is a step number.)

Also, the control voltage correction amount $\Delta V cont$ relative to an average value in one period of the triangular wave is $\Delta V cont=(\Delta f(1)+\Delta f(2)+ \ldots +\Delta f(n))/Kv/n$ (n is a step number.)

As will be mentioned later, a description will be given on one example of performing feedback control by shifting the control voltage values by a certain correction amount to the detected frequency error (center frequency error and frequency shift error). It becomes possible to perform more prompt correction by directly obtaining the control voltage correction amount $\Delta V cont$, and by changing the control voltage by the obtained control voltage correction amount $\Delta V cont$.

Figure 6A:
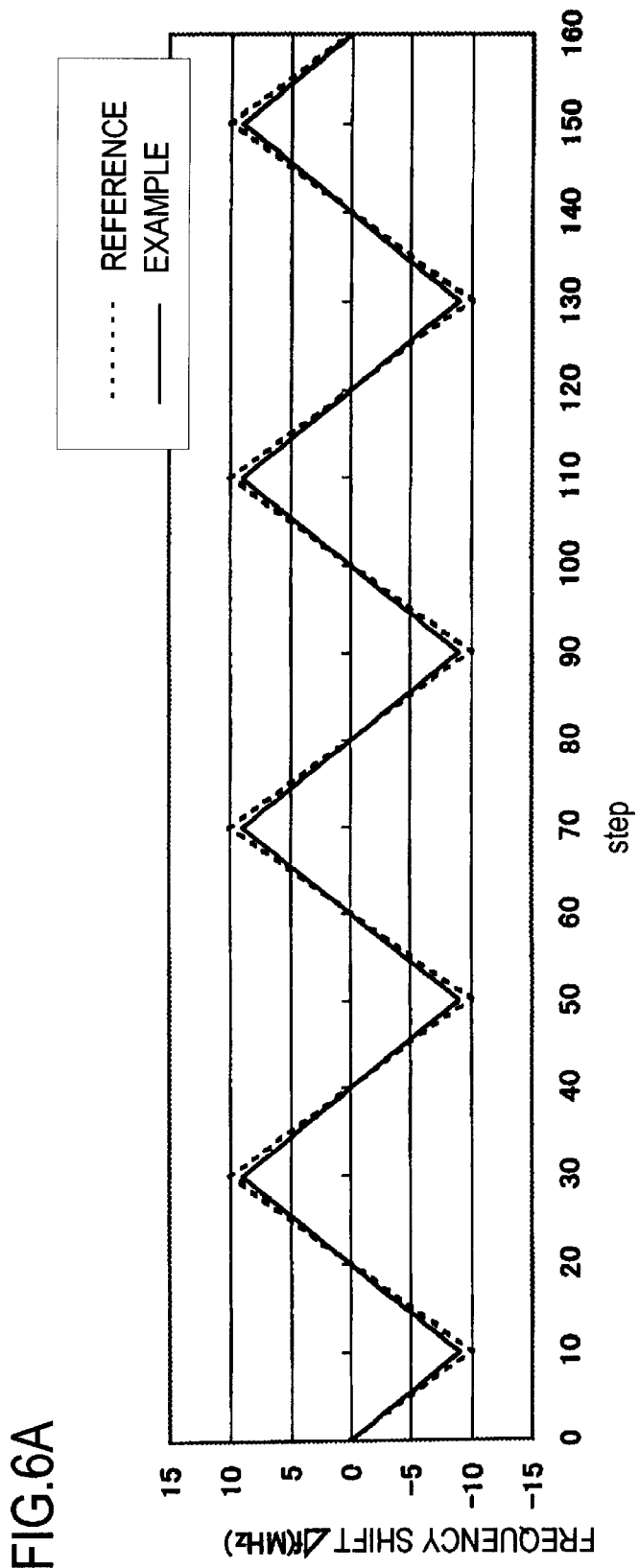
FIG. 6A is a diagram describing an example (example 2) in a case of calculating frequency shift error of the VCO output frequency relative to the reference.

FIGS. 6A-6E are diagrams describing the example 2. As illustrated in FIG. 6A, the example 2 is a case that the frequency shift of the VCO output frequency is 1.0 MHz smaller in comparison with the criterion, and no error is produced in the center frequency. Here, there will be described a method for deriving through calculation that the frequency shift is 1.0 MHz smaller, without an error in the center frequency. Similar to the case of the example 1, in regard to the criterion, on the assumption that a VCO oscillation frequency (center frequency) is 2.5 GHz, a frequency shift is 10 MHz and a triangular wave frequency is 100 Hz, a reference output frequency has a waveform illustrated by the dotted line in FIG. 6A. In contrast, a waveform having a frequency shift of being 1.0 MHz smaller than the reference output frequency (without center frequency error) is illustrated by the solid line in FIG. 6A.

Figure 6B:
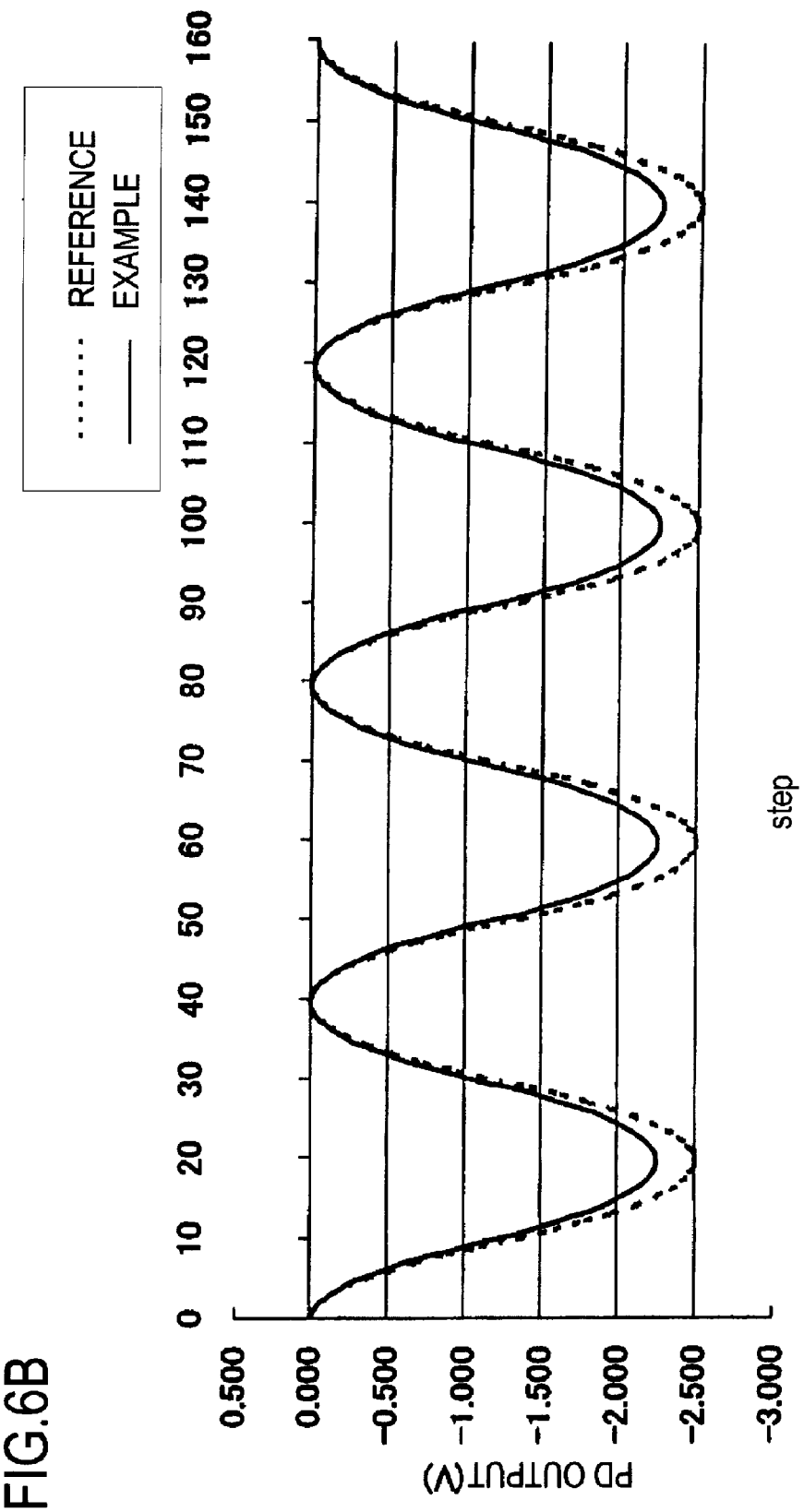
FIG. 6B is a diagram describing an example (example 2) in a case of calculating frequency shift error of the VCO output frequency relative to the reference.

FIG. 6B illustrates the outputs (error voltage signals) of the phase detector corresponding to the dotted line and the solid line in FIG. 6A. The waveform illustrated by the dotted line in FIG. 6B is the error voltage signal of the phase detector when the VCO output frequency is identical to the criterion, while the waveform illustrated by the solid line in FIG. 6B is the error voltage signal of the phase detector when the frequency shift of the output frequency is 1.0 MHz smaller in comparison with the criterion (without center frequency error). Namely, when the frequency shift of the output frequency is 1.0 MHz smaller in comparison with the criterion (without center frequency error), the phase change between with the reference frequency is smaller in comparison with the criterion. Accordingly, the amplitude of the sine wave is smaller in comparison with the case of the criterion.

Figure 6C:
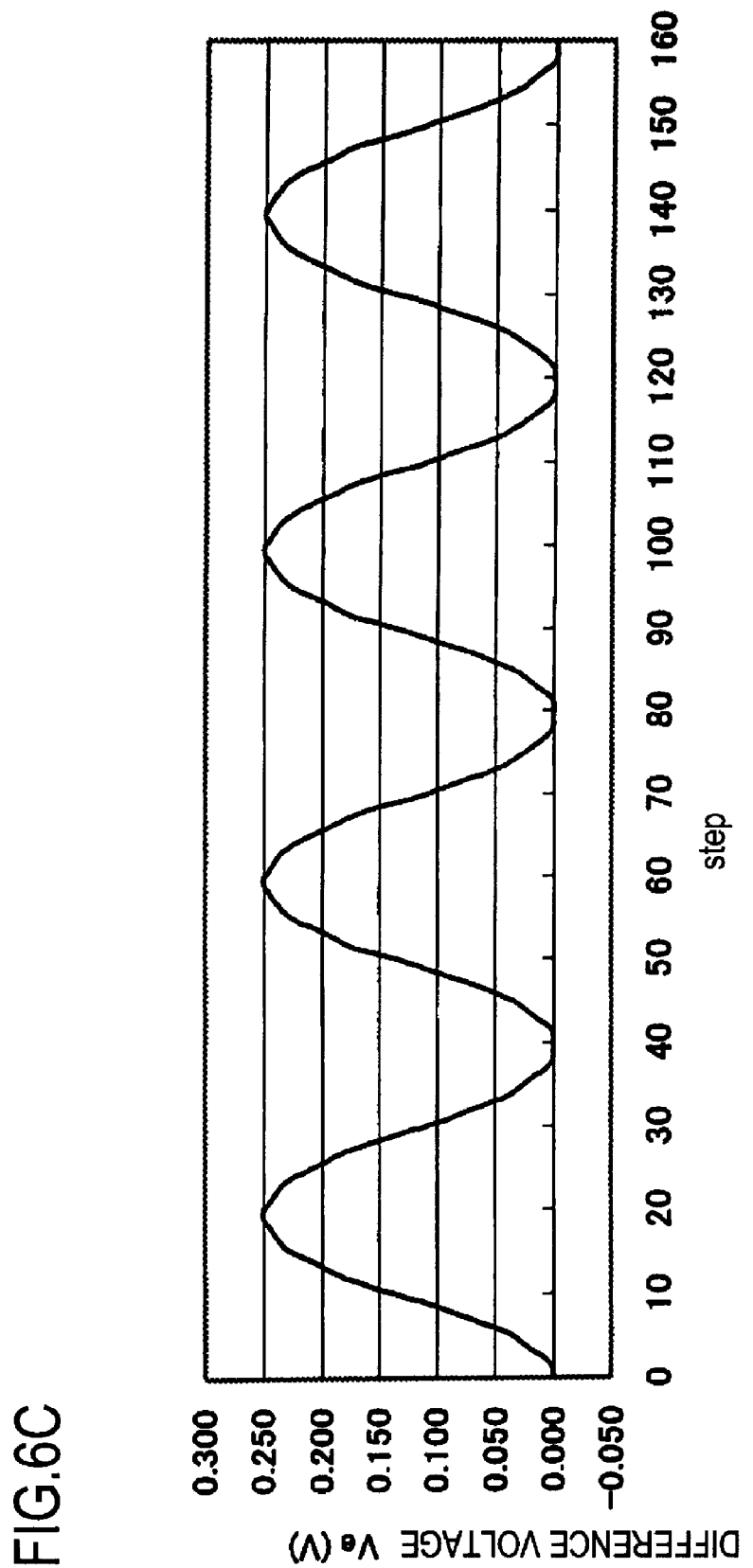
FIG. 6C is a diagram describing an example (example 2) in a case of calculating frequency shift error of the VCO output frequency relative to the reference.

FIG. 6C illustrates a difference between the waveforms illustrated by the dotted line and the solid line in FIG. 6B, representing a difference of the error voltage signal from the criterion when the frequency shift of the VCO output frequency is 1.0 MHz smaller in comparison with the criterion (without center frequency error). It is understood from FIG. 6C that the difference changes periodically in a sine wave shape.

Figure 6D:
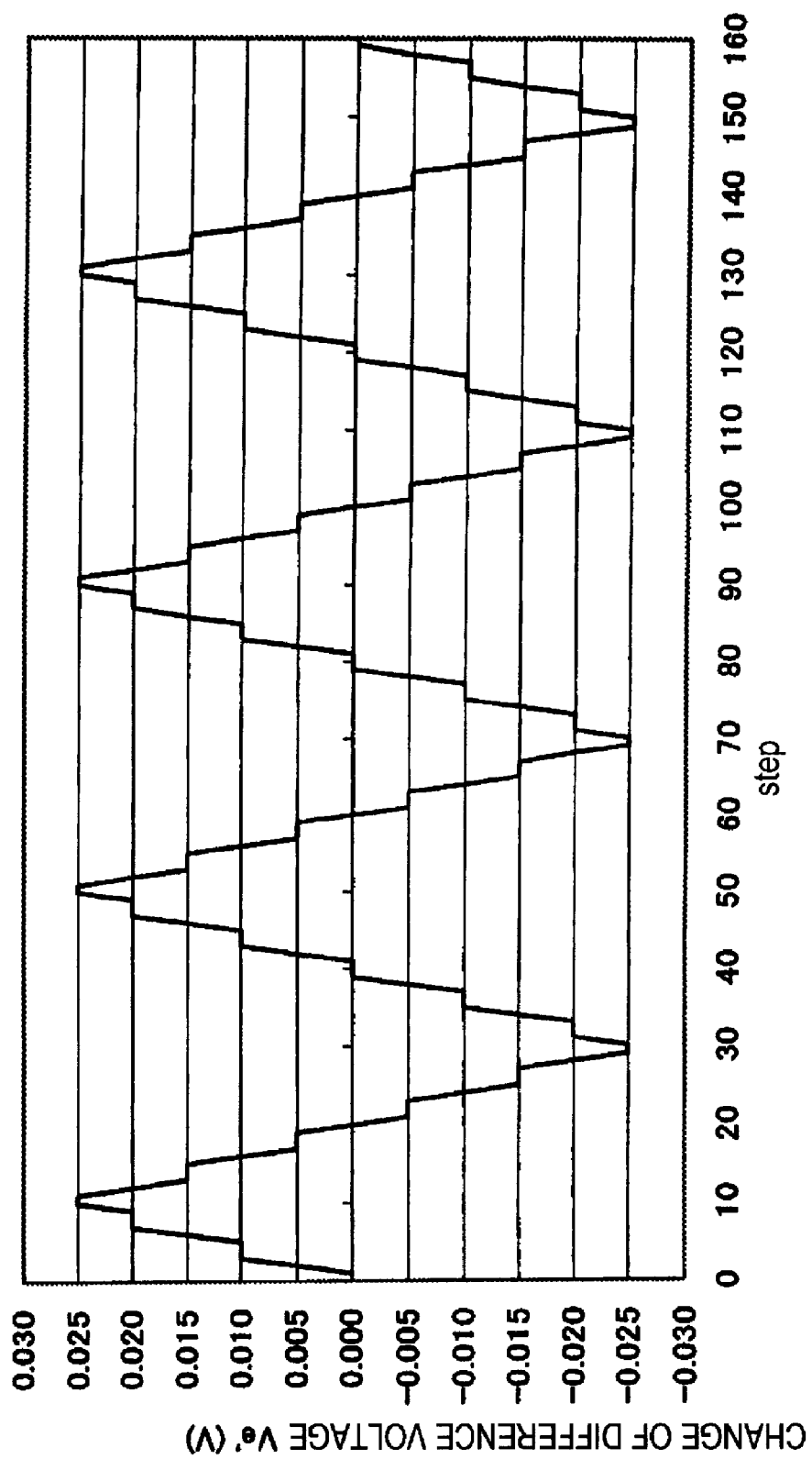
FIG. 6D is a diagram describing an example (example 2) in a case of calculating frequency shift error of the VCO output frequency relative to the reference.

FIG. 6D illustrates the differentiation result of the difference value obtained in FIG. 6C. The calculation method of the differentiation is similar to the case of the example 1, such that a change (differentiated value) $Ve'(n)$ of the error voltage (Ve) is obtained. In the case of the example 2, because the phase difference is periodically changing in a sine wave shape (FIG. 6C), the change (differentiated value) of the error voltage periodically changes in a triangular wave shape.

After obtaining the change (differentiated value) of the error voltage, the obtained differentiated value is converted into a frequency change $\Delta f(n)$ by use of a sensitivity Kd (V/Hz) of the phase detector, in a similar manner to the case of the example 1.

Figure 6E:
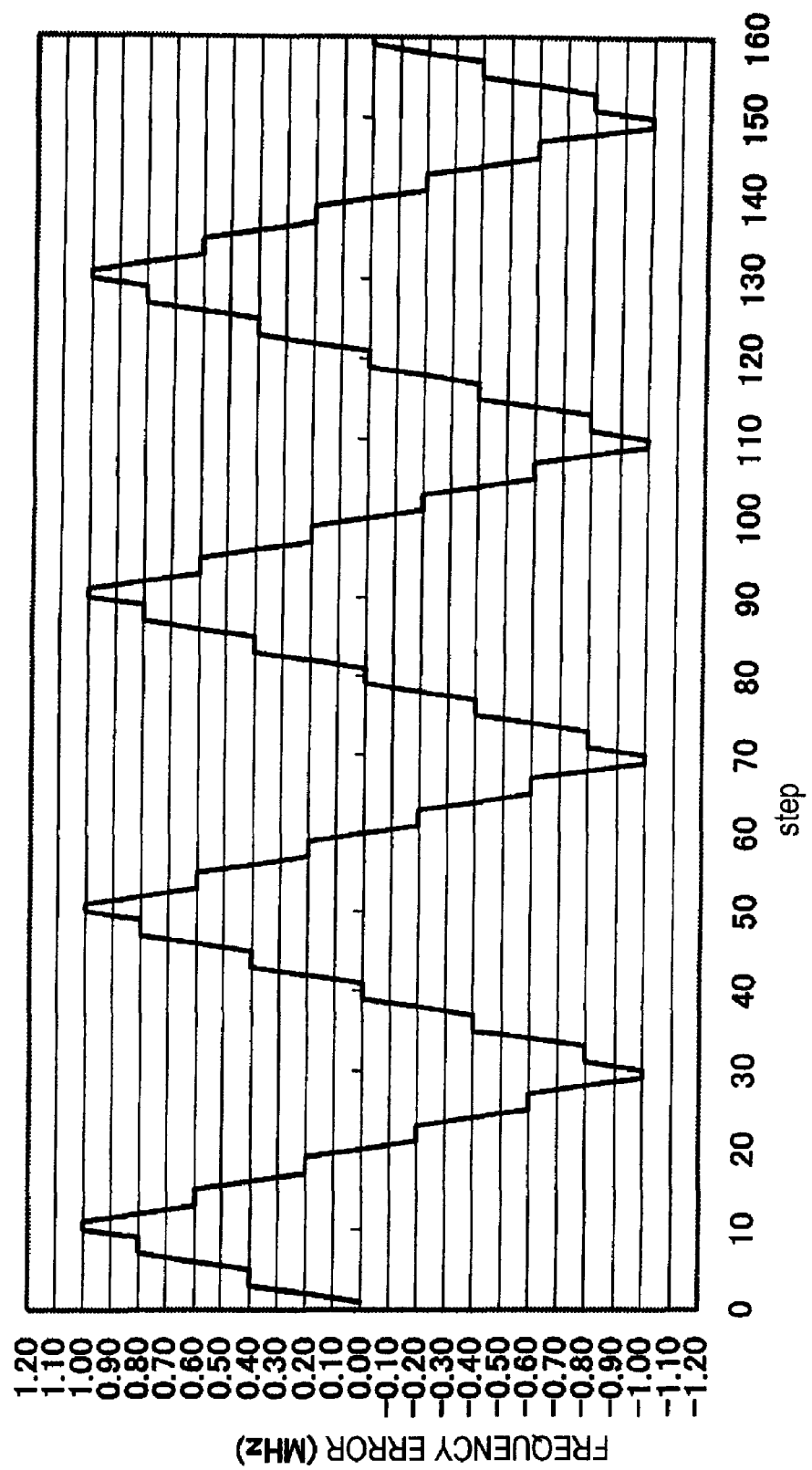
FIG. 6E is a diagram describing an example (example 2) in a case of calculating frequency shift error of the VCO output frequency relative to the reference.

FIG. 6E illustrates a frequency change in the case of the example 2. In comparison with the criterion, the VCO output frequency has no error in a center frequency portion and deviates by +1 MHz in a portion in which a maximum frequency shift is produced. Accordingly, it is understood that the frequency shift is 1.0 MHz smaller, without a center frequency error. As such, by comparing the output (FIG. 6B) of the phase detector with the criterion, and by obtaining the difference therebetween, it is possible to detect the frequency shift error from the differentiation result of the above difference. Further, in the case of FIG. 6E also, it is possible to obtain the control voltage correction amount ΔVcont corresponding to the frequency error amount, as having been described in FIG. 5E.

Figure 7A:
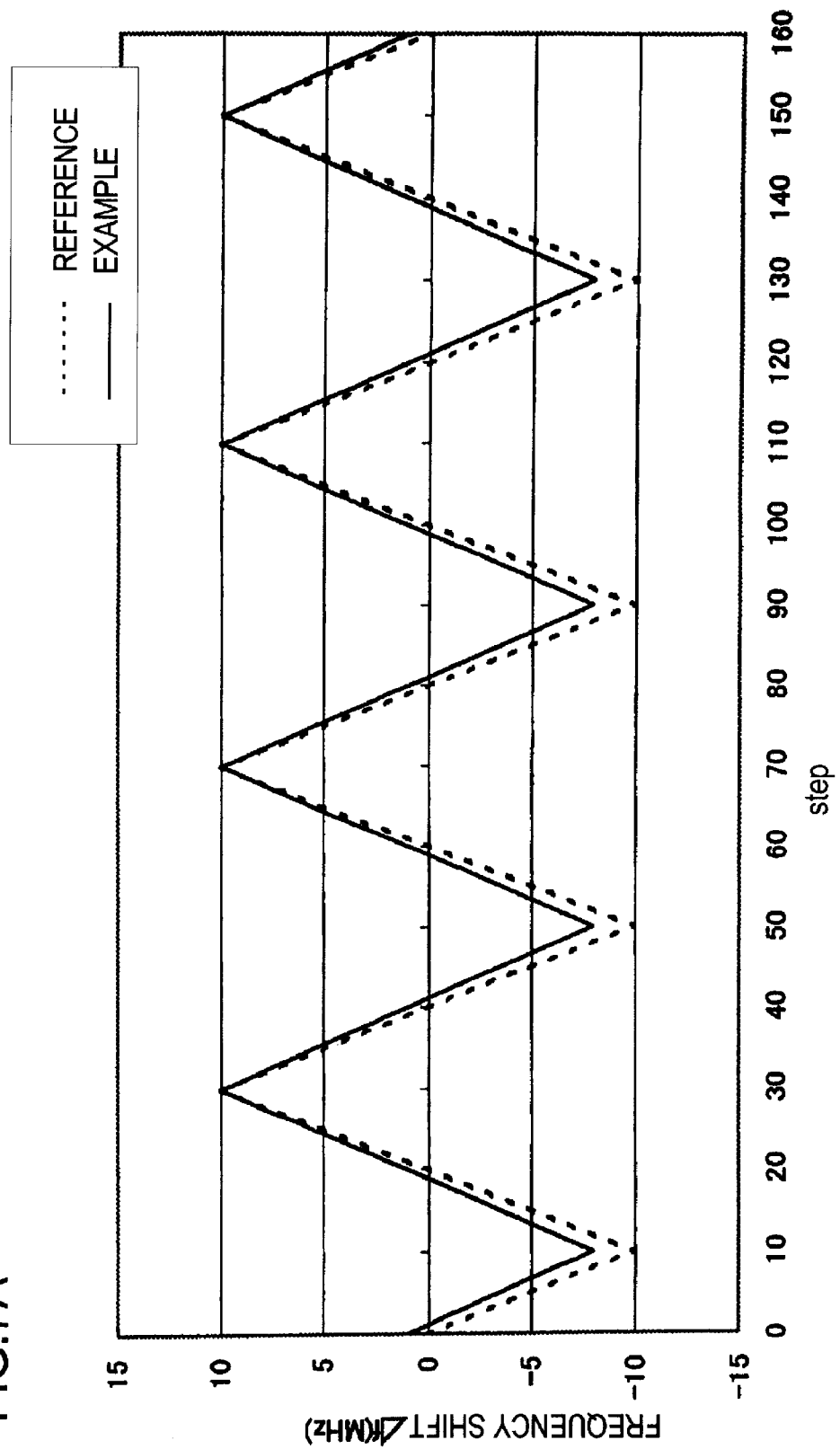
FIG. 7A is a diagram describing an example (example 3) in a case of calculating both center frequency error and frequency shift error of the VCO output frequency relative to the reference.

FIGS. 7A-7E are diagrams describing the example 3. As illustrated in FIG. 7A, the example 3 is a case that the center frequency of the VCO output frequency is 1 MHz higher, and the frequency shift is 1.0 MHz smaller, in comparison with the criterion. In other words, it is a combined case of the example 1 with the example 2 described above. Now, there will be described a method for deriving through calculation that the center frequency is 1 MHz higher and the frequency shift is 1 MHz smaller. Similar to the cases of the example 1 and the example 2, in regard to the criterion, on the assumption that a VCO oscillation frequency (center frequency) is 2.5 GHz, a frequency shift is 10 MHz and a triangular wave frequency is 100 Hz, a reference output frequency has a waveform illustrated by the dotted line in FIG. 7A. In contrast, a waveform in which a center frequency is 1 MHz higher and a frequency shift is 1.0 MHz smaller than the reference output frequency is illustrated by the solid line in FIG. 7A.

Figure 7B:
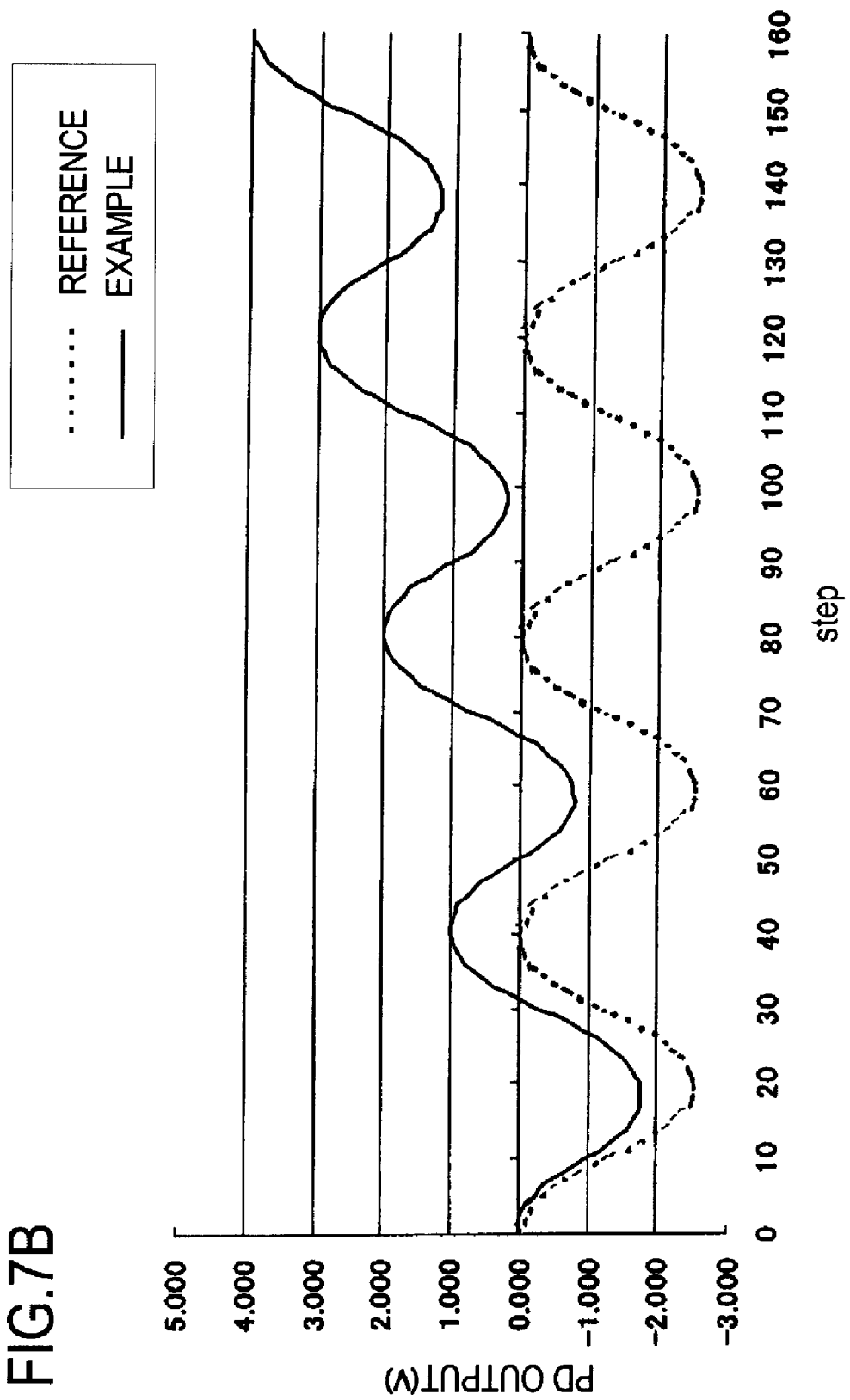
FIG. 7B is a diagram describing an example (example 3) in a case of calculating both center frequency error and frequency shift error of the VCO output frequency relative to the reference.

FIG. 7B illustrates the outputs (error voltage signals) of the phase detector corresponding to the dotted line and the solid line in FIG. 7A. The waveform illustrated by the dotted line in FIG. 7B is the error voltage signal of the phase detector when the VCO output frequency is identical to the criterion, while the waveform illustrated by the solid line in FIG. 7B is the error voltage signal of the phase detector when the center frequency of the output frequency is 1 MHz higher and the frequency shift is 1.0 MHz smaller. Namely, when the center frequency of the output frequency is 1 MHz higher and the frequency shift is 1.0 MHz smaller, the phase difference between with the reference frequency becomes spreading as in the example 1. Accordingly, the output value is gradually increasing with a change in a sine wave shape. Thus, the difference between with the reference output value becomes increasing. Also, because the phase change between with the reference frequency is smaller in comparison with the criterion, the amplitude of the sine wave becomes smaller in comparison with the case of the criterion.

Figure 7C:
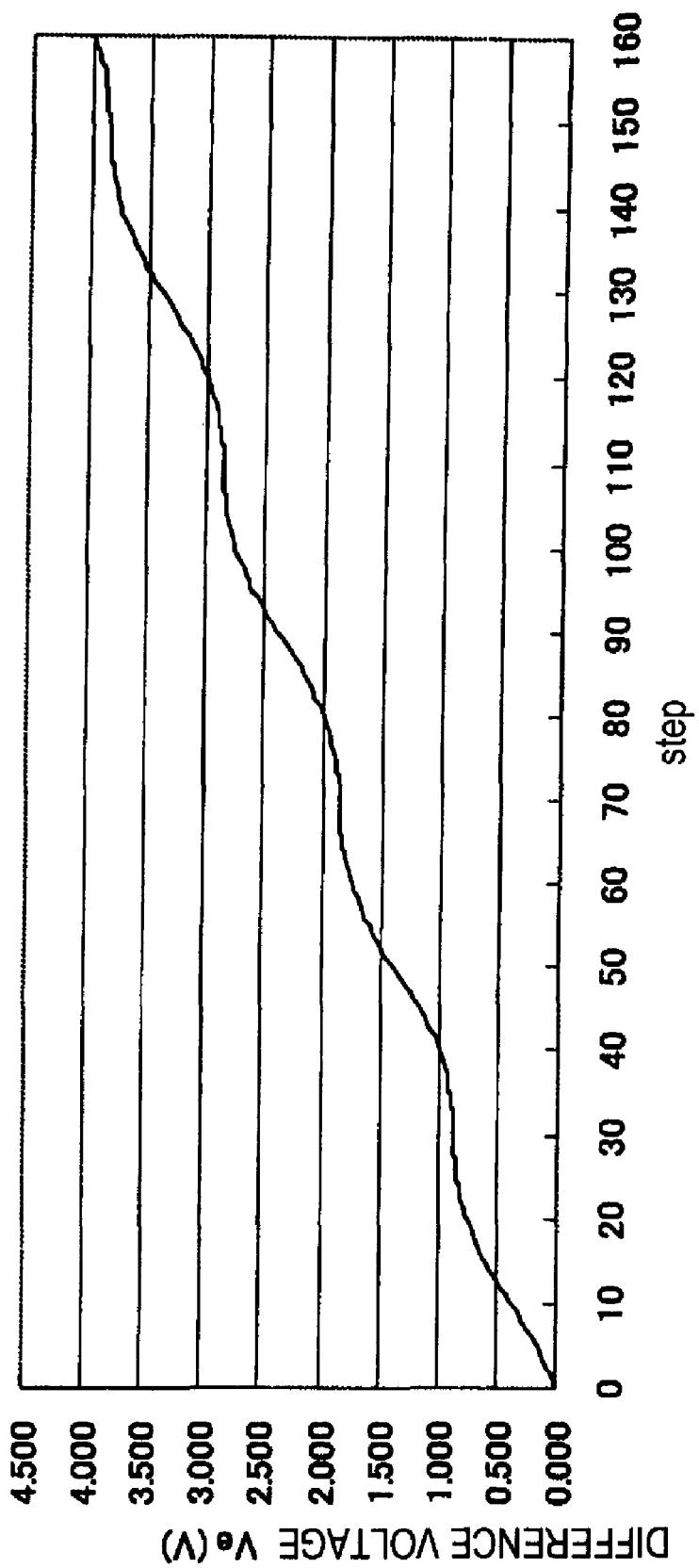
FIG. 7C is a diagram describing an example (example 3) in a case of calculating both center frequency error and frequency shift error of the VCO output frequency relative to the reference.

FIG. 7C illustrates a difference between the waveforms illustrated by the dotted line and the solid line in FIG. 7B, representing a difference of the error voltage signal from the criterion when the center frequency of the VCO output frequency is 1 MHz higher and the frequency shift is 10 MHz smaller. It is understood from FIG. 7C that, while the difference changes in a sine wave shape, the magnitude thereof is gradually increasing.

Figure 7D:
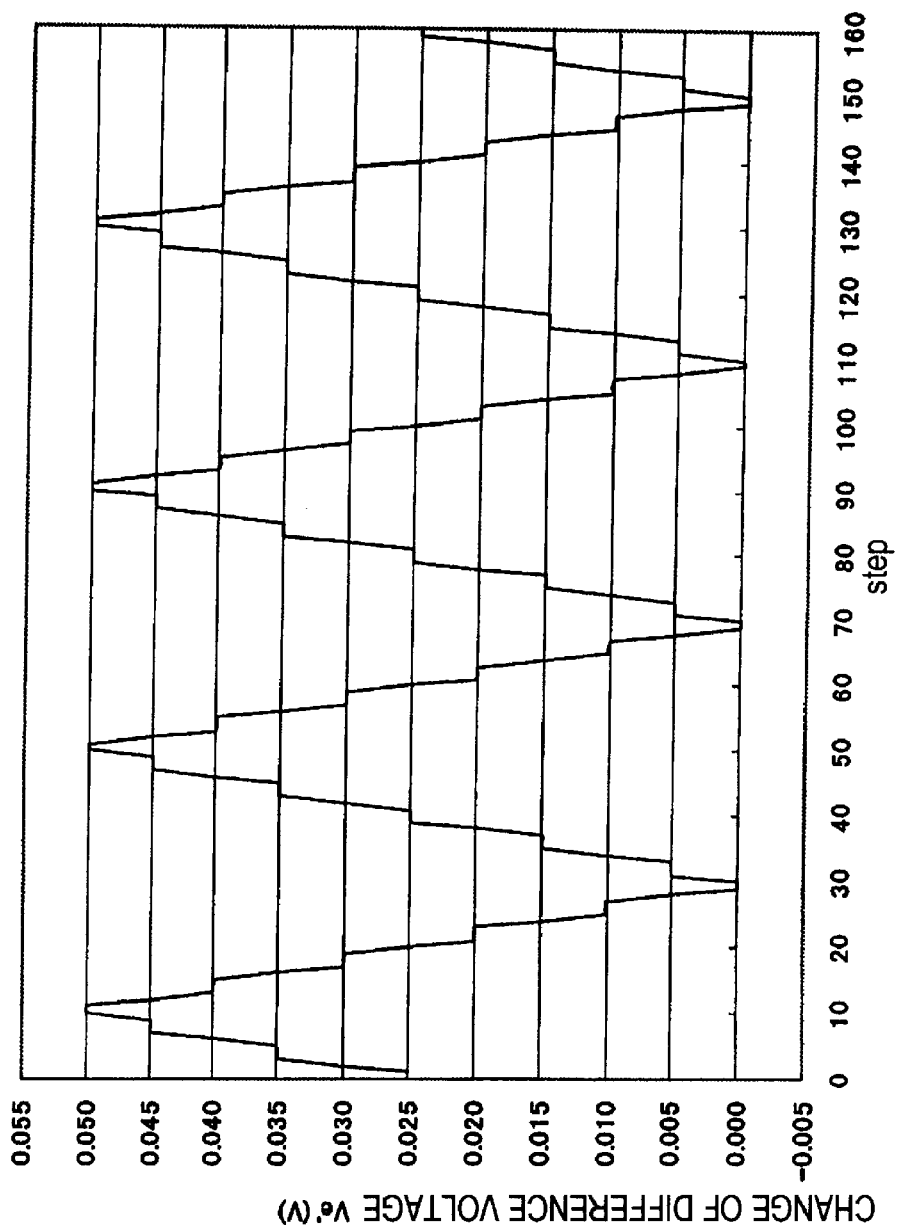
FIG. 7D is a diagram describing an example (example 3) in a case of calculating both center frequency error and frequency shift error of the VCO output frequency relative to the reference.

FIG. 7D illustrates the differentiation result of the difference value obtained in FIG. 7C. The calculation method of the differentiation is similar to the case of the example 1, such that a change (differentiated value) Ve'(n) of the error voltage (Ve) is obtained. In the case of the example 3, because the phase difference is periodically changing in a sine wave shape, and also the difference value is increasing (FIG. 7C), the change (differentiated value) of the error voltage periodically changes in a triangular wave shape, with the center frequency thereof deviating by a certain value (0.025 V).

After obtaining the change (differentiated value) of the error voltage, the obtained differentiated value is converted into a frequency change Δf(n) by use of a sensitivity Kd (V/Hz) of the phase detector, in a similar manner to the case of the example 1.

Figure 7E:
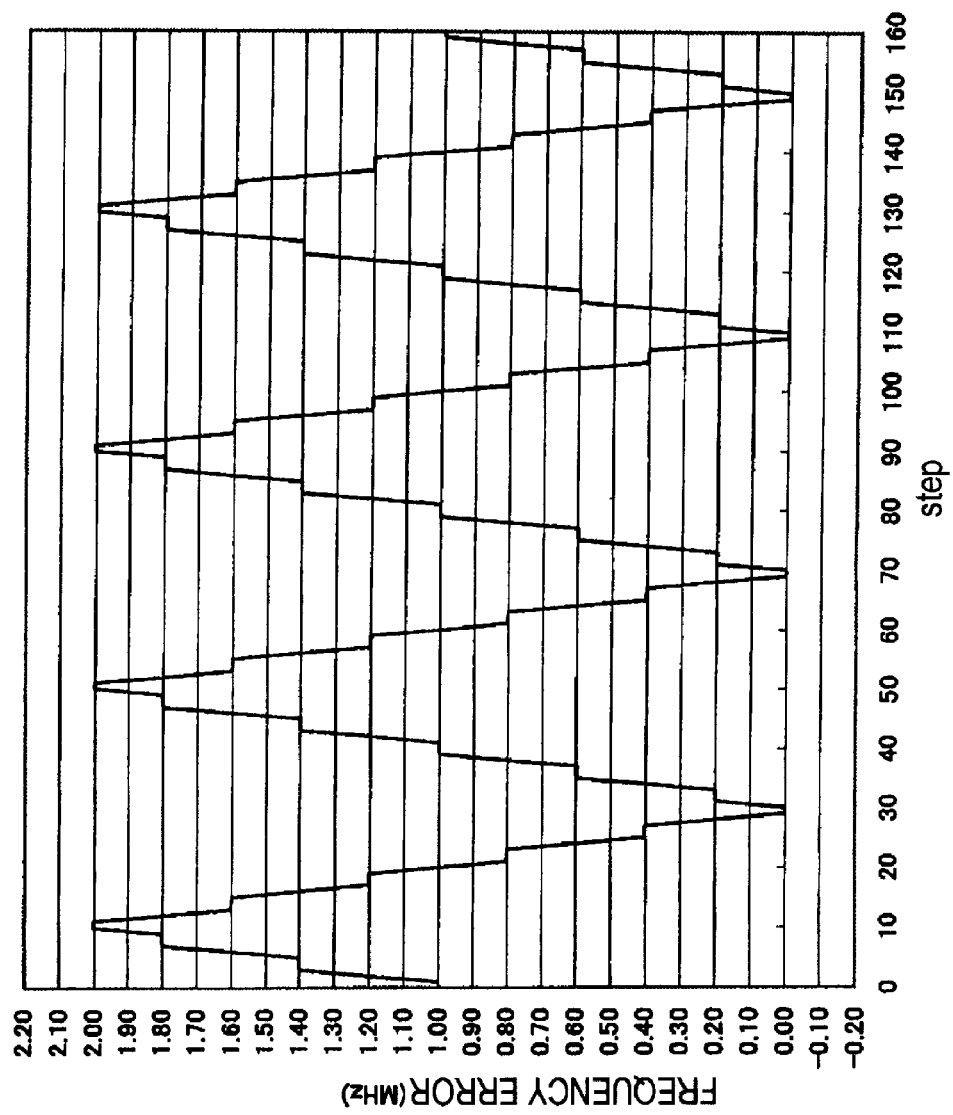
FIG. 7E is a diagram describing an example (example 3) in a case of calculating both center frequency error and frequency shift error of the VCO output frequency relative to the reference.

FIG. 7E illustrates a frequency change in the case of the example 3. In comparison with the criterion, the VCO output frequency has an error of +1 MHz in a center frequency portion, and deviates by +1 MHz in a portion in which a maximum frequency shift is produced. Accordingly, it is understood that the center frequency of the VCO output frequency is 1 MHz higher and the frequency shift is 1.0 MHz smaller. As such, by comparing the output (FIG. 7B) of the phase detector with the criterion, and by obtaining the difference therebetween, it is possible to detect both the center frequency error and the frequency shift error from the differentiation result of the above difference. Further, in the case of FIG. 7E also, it is possible to obtain the control voltage correction amount ΔVcont corresponding to the frequency error amount, as having been described in FIG. 5E.

As described above, the method for detecting the center frequency error and the frequency shift error from the output of the phase detector has been explained. The above detection method can be executed during radar operation. CPU 43 detects the center frequency error and the frequency shift error of the VCO output frequency, based on the output of the phase comparator unit 20 passing through LPF 31 illustrated in FIG. 4.

Next, there will be described a method for correcting the frequency modulation characteristic real time, based on the center frequency error and the frequency shift error detected by the above-mentioned method. CPU 43 controls a control voltage to be supplied to VCO 50, so as to control an output frequency from VCO 50. Accordingly, in the correction method described below, the corrections of the control voltage of the center frequency, which is preset as an initial value, and the change rate per step are made on the basis of the detected center frequency error and the frequency shift error. Hereafter, the change rate of the control voltage per step is referred to as a gradient Kc (V/step). When the triangular wave is controlled on the basis of 40 steps per period, and the output frequency is shifted by +10 MHz from the center frequency, the gradient Kc comes to correspond to a control voltage to produce an output frequency change of 0.5 MHz.

The gradient Kc (V/step) and the modulation sensitivity Kv (MHz/V) has a relation illustrated below:

Gradient $Kc(V/\text{step})$=Frequency change amount per step(MHz/step)/Modulation sensitivity $Kv(\text{MHz}/V)$ Because the frequency change amount per step (MHz/step) becomes a constant obtained from the amplitude (maximum frequency shift) and the period of the triangular wave to be used as a criterion, the correction of the gradient Kc virtually signifies the correction of the modulation sensitivity Kv.

The principle of the correction is to correct the control voltage for the center frequency in a manner as to make the center frequency error zero, and to correct the gradient Kc to make the frequency shift error zero.

Figure 8A:
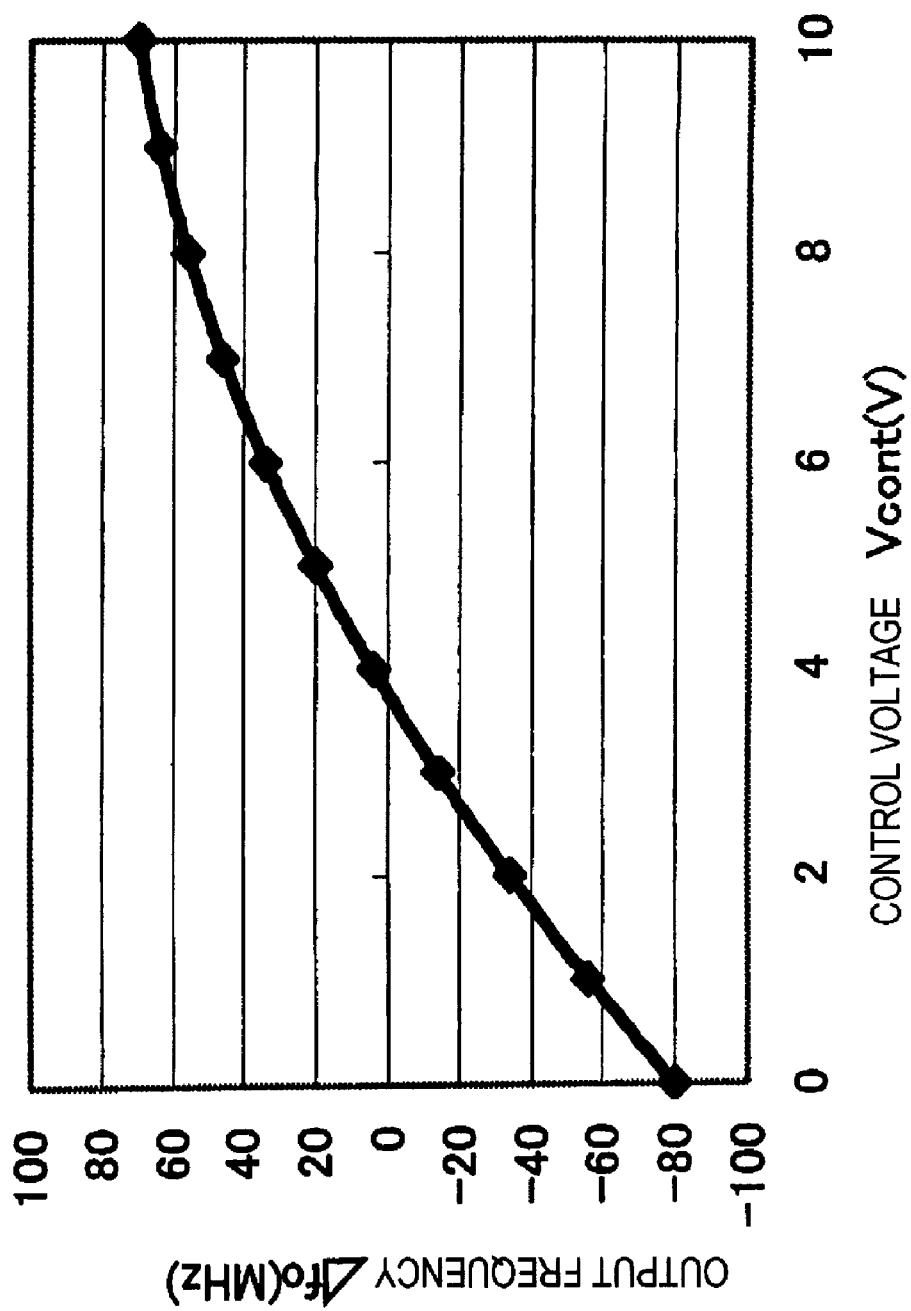
FIG. 8A is a diagram describing a first correction method for correcting the center frequency error and the frequency shift error.
Figure 8C:
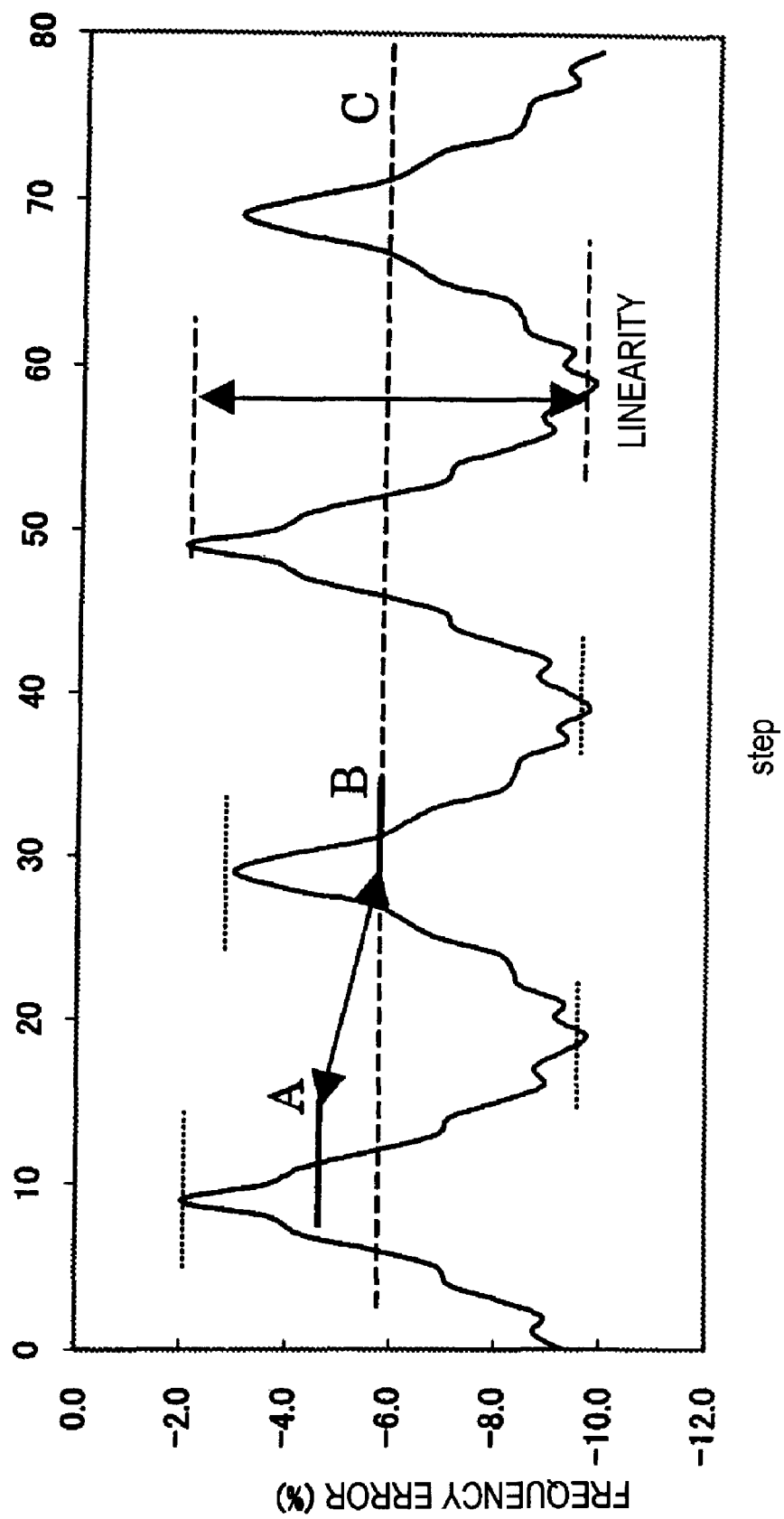
FIG. 8C is a diagram describing a first correction method for correcting the center frequency error and the frequency shift error.

FIGS. 8A-8C are diagrams describing a first correction method for correcting the center frequency error and the frequency shift error. The first correction method is a correction method when a single gradient Kc1 is set throughout one period of the triangular wave.

FIG. 8A is a diagram illustrating an exemplary frequency modulation characteristic of VCO 50. As illustrated in the figure, the frequency modulation characteristic is nonlinear relative to the control voltage, and however, an initial value of the gradient Kc1 to approximate the above frequency modulation characteristic is set beforehand. Also, an initial value of the control voltage value Vc_center for the center frequency is also set beforehand.

By means of the method described earlier, when the center frequency error and the frequency shift error are detected, CPU 43 corrects the control voltage value Vc_center for the center frequency and the gradient Kc1, according to the control illustrated below.

(1-1) Correction of Center Frequency

FIG. 8B is a diagram illustrating the waveform of the triangular wave, in which the dotted line is the waveform of the reference triangular wave, and the solid line is the waveform of the triangular wave corrected by the first correction method. FIG. 8C is a diagram illustrating an exemplary frequency error from the criterion. The control voltage value Vc_center is controlled so that an average frequency error C in one period of the triangular wave comes to be an offset value 0. Typically, through feedback control, the control voltage value Vc_center for the center frequency is offset on a predetermined value-by-value basis in a direction to decrease the average value C of the detected center frequency error for one period of the triangular wave, and the control voltage value Vc_center is controlled so that the average value C becomes the offset value 0.

(1-2) Correction of Frequency Shift

For example, when a frequency error as illustrated in FIG. 8C is produced, a comparison is made between an average value A (A in FIG. 8C) of the maximum value and the minimum value of the frequency error in a downward convex portion (1st-20th steps) of the triangular wave and an average value B (B in FIG. 8) of the maximum value and the minimum value of the frequency error in an upward convex portion (21st-40th steps). Then, through feedback control, the gradient Kc1 is changed on a predetermined value-by-value basis in a direction to make both average values A, B equal. Typically, when the average value A>the average value B, it is controlled to increase the gradient Kc1, while when the average value A<the average value B, it is controlled to decrease the gradient Kc1.

Through the above-mentioned method, the center frequency error and the frequency shift error are corrected, and thus, the triangular wave illustrated by the solid line in FIG. 8B is obtained.

Additionally, in the first correction method, the frequency modulation characteristic is approximated by a single gradient Kc1, and linearity correction is not performed, resulting in the frequency shift errors of −10% maximum and −2% minimum (an error width of 8.0 points).

Figure 9A:
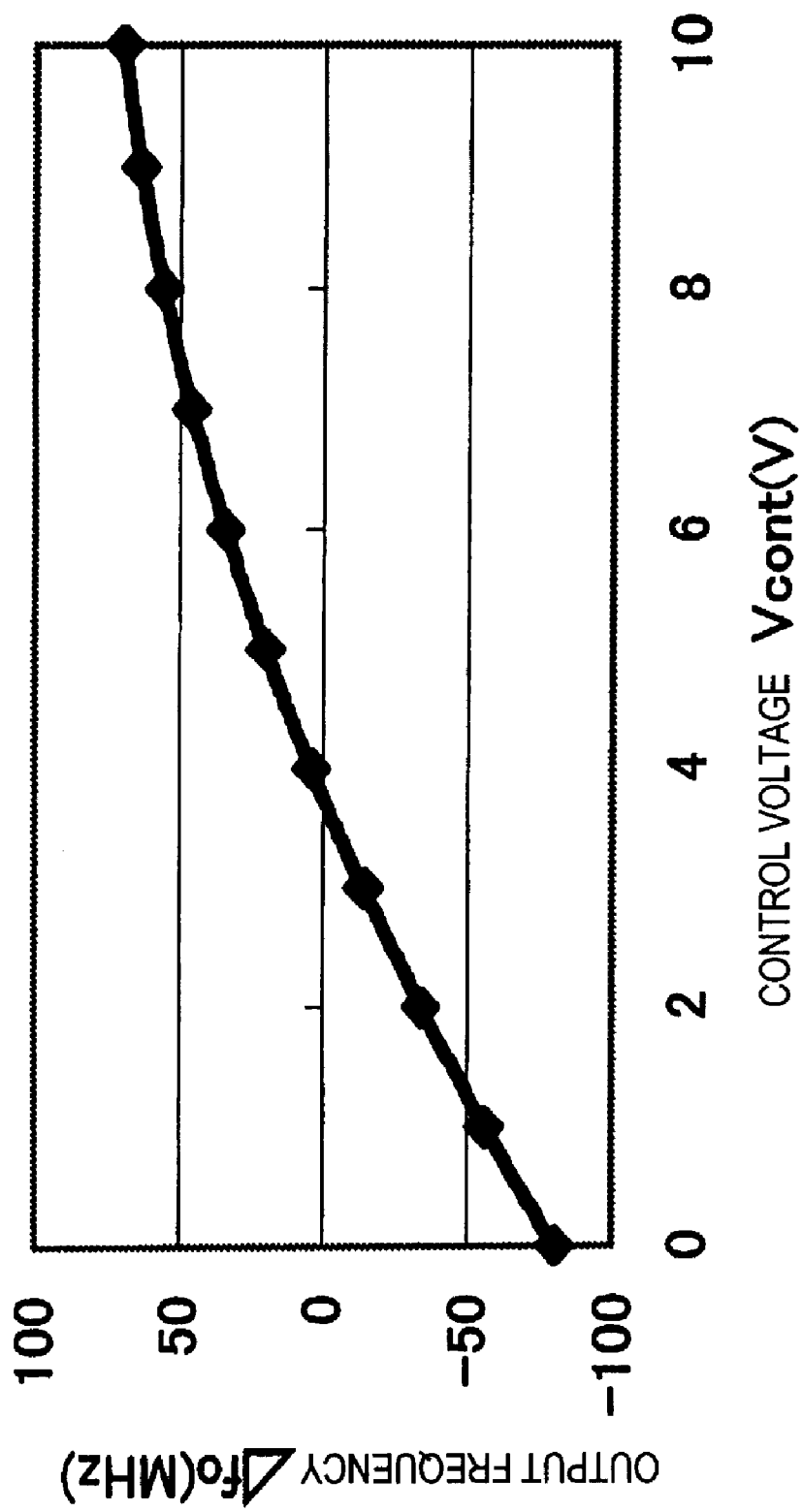
FIG. 9A is a diagram describing a second correction method for correcting the center frequency error and the frequency shift error.

FIGS. 9A-9C are diagrams describing a second correction method for correcting the center frequency error and the frequency shift error. The second correction method is a correction method when different gradients Kc1, Kc2 are set for the section of a downward convex portion (the section having a lower frequency than the center frequency) and for the section of an upward convex portion (the section having a higher frequency than the center frequency) respectively, in one period of the triangular wave.

FIG. 9A is a diagram illustrating an exemplary frequency modulation characteristic of VCO 50, which is identical to FIG. 8A. With regard to the above frequency modulation characteristic, according to the second correct ion method, the gradient Kc1 of the control voltage in the downward convex portion of the triangular wave and the gradient Kc2 of the control voltage in the upward convex portion are respectively defined, and the initial values thereof are set beforehand. Also, the initial value of the control voltage value Vc_center for the center frequency is also set beforehand. Each initial value of the control voltage value Vc_center is identical for the respective sections of the downward convex portion and the upward convex portion of the triangular wave.

(2-1) Correction of Center Frequency

FIG. 9B is a diagram illustrating the waveform of the triangular wave, in which the dotted line is the waveform of the reference triangular wave, and the solid line is the waveform of the triangular wave corrected by the second correction method (although the dotted line and the solid line are substantially overlapped in the figure, a strict difference exists). FIG. 9C is a diagram illustrating an exemplary frequency error from the criterion. In the second correction method, the correction of the control voltage value Vc_center for the center frequency is made also by the separation of the downward convex portion of the triangular wave from the upward convex portion.

Namely, a control voltage value Vc_center_A in the section of the downward convex portion of the triangular wave is controlled so that the average frequency error C in the section concerned becomes zero, and also, a control voltage value Vc_center_B in the section of the upward convex portion of the triangular wave is controlled so that the average frequency error C' in the sect ion concerned becomes the offset value 0. Typically, through feedback control, the control voltage values Vc_center_A and Vc_center_B for the center frequency are offset on a predetermined value-by-value basis in a direction to decrease the average value C in the upper convex portion of the triangular wave of the detected center frequency error and the average value C' in the downward convex portion thereof, respectively, and the control voltage values Vc_center_A and Vc_center_B are controlled so that the aforementioned respective values C, C' become the offset value 0.

(2-2) Correction of Frequency Shift

For example, when a frequency error as illustrated in FIG. 9C is produced, the downward convex portion (1st-20th steps) of the triangular wave is further divided into upper and lower half portions. Then, through feedback control, the gradient Kc1 is changed on a predetermined value-by-value basis in a direction such that a frequency error A in the vicinity of the center frequency of the upper halves (1st-5th steps and 16th-20th steps) of the downward convex portion and a frequency error B in the vicinity of the maximum frequency shift in the lower half (6th-15th steps) of the downward convex portion become equal. Typically, in case that the value A<the value B, control is made to increase the gradient Kc1, while in case that the value A>the value B, control is made to decrease the gradient Kc1.

Further, similar control is also performed on the upward convex portion of the triangular wave. Namely, the upward convex portion (21st-40th steps) of the triangular wave is further divided into upper and lower half portions. Then, through feedback control, the gradient Kc2 is changed on a predetermined value-by-value basis in a direction such that a frequency error A' in the vicinity of the center frequency of the lower halves (21st-25th steps and 36th-40th steps) of the upward convex portion and a frequency error B' in the vicinity of the maximum frequency shift in the upper half (26th-35th steps) of the upward convex portion become equal. Typically, in case that the value A'>the value B', control is made to increase the gradient Kc2, while in case that the value A'<the value B', control is made to decrease the gradient Kc2.

Through the above-mentioned method, the center frequency error and the frequency shift error are corrected, and thus, the triangular wave illustrated by the solid line in FIG. 9B is obtained.

Additionally, in the second correction method, linearity correction is performed because of approximation of the frequency modulation characteristic by two gradients Kc1, Kc2, resulting in the frequency shift errors of +1.0% maximum and −1.7% minimum (an error width of 2.7 points). In comparison with the case of FIG. 8C, the error width is reduced to a small value.

Figure 10A:
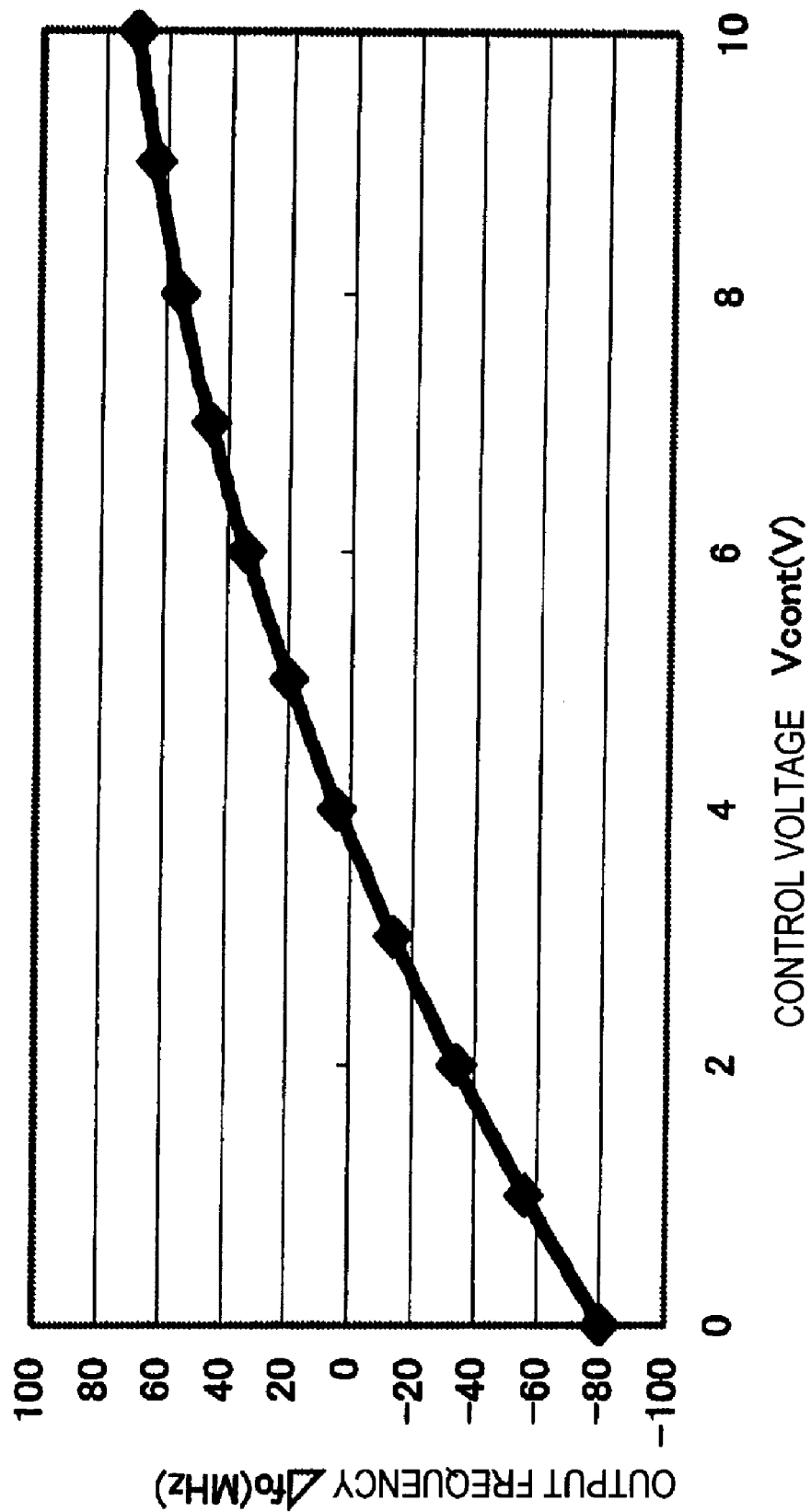
FIG. 10A is a diagram describing a third correction method for correcting the center frequency error and the frequency shift error.

FIGS. 10A-10C are diagrams describing a third correction method for correcting the center frequency error and the frequency shift error. The third correction method is a correction method when different gradients Kc1, Kc2, Kc3 and Kc4 are respectively set for the upper half sections (1st-5th and 16th-20th steps) and the lower half section (6th-15th steps) of a downward convex portion, and for the lower half sections (21st-25th and 36th-40th steps) and the upper half section (26th-35th steps) of an upward convex portion, respectively in one period of the triangular wave.

Here, with regard to the 1st-5th steps and the 16th-20th steps in the section having the gradient Kc1, the frequency changes thereof are mutually in a symmetric relationship (only the change directions are different), and therefore, it is sufficient if the center frequency error and the frequency shift error in either one of the sections are detected. In the following explanation, the section having the gradient Kc1 indicates the section of the 1st-5th steps. Similarly, the section having the gradient Kc2 indicates the section of the 6th-10th steps, the section having the gradient Kc3 indicates the section of the 21st-25th, and the section having the gradient Kc4 indicates the section of the 26th-30th.

FIG. 10A is a diagram illustrating an exemplary frequency modulation characteristic of VCO 50, which is identical to FIG. 8A and FIG. 9A. With regard to the above frequency modulation characteristic, according to the third correction method, four (4) gradients Kc1, Kc2, Kc3 and Kc4 are defined respectively for the aforementioned sections obtained by dividing one period of the triangular wave into 4, and the initial values thereof are set beforehand. Also, the initial value of the control voltage value Vc_center for the center frequency is also set beforehand. Each initial value of the control voltage value Vc_center is identical for each of the aforementioned sections of the triangular wave.

(3-1) Correction of Center Frequency

FIG. 10B is a diagram illustrating the waveform of the triangular wave, in which the dotted line is the waveform of the reference triangular wave, and the solid line is the waveform of the triangular wave corrected by the third correction method (although the dotted line and the solid line are substantially overlapped in the figure, a strict difference exists). FIG. 10C is a diagram illustrating an exemplary frequency error from the criterion. In the third correction method, correction is made after the triangular wave is divided in more detail than in the second correction method, and however, the correction principle is similar to the principle of the aforementioned correction methods. Namely, a control voltage value Vc_center_A is controlled in such a manner that the average frequency error C in the section having the gradient Kc1 (the upper half of the downward convex portion) of the triangular wave becomes zero, and a control voltage value Vc_center_B is controlled in such a manner that the average frequency error C' in the section having the gradient Kc2 (the lower half of the downward convex portion) of the triangular wave becomes zero, and a control voltage value Vc_center_C is controlled in such a manner that the average frequency error C" in the section having the gradient Kc3 (the lower half of the upward convex portion) of the triangular wave becomes zero, and a control voltage value Vc_center_D is controlled in such a manner that the average frequency error C'" in the section having the gradient Kc4 (the upper half of the upward convex portion) of the triangular wave becomes zero. Typically, through feedback control, the control voltage values Vc_center_A through Vc_center_D for the center frequency are offset on a predetermined value-by-value basis in a direction such that the respective average values C, C', C' and C'" of the detected center frequency errors become decreased, and in such a manner that the above respective values become the offset value 0, the control voltage values Vc_center_A-Vc_center_D are controlled.

(3-2) Correction of Frequency Shift

For example, when a frequency error as illustrated in FIG. 10C is produced, through feedback control, the gradient Kc1 is changed on a predetermined value-by-value basis in a direction such that a frequency error A at the top of the section (1st step) in the section having the gradient Kc1 (1st-5th steps) of the triangular wave becomes equal to a frequency error B at the tail of the section (5th step). Typically, in case that the value A<the value B, control is made to increase the gradient Kc1, while in case that the value A>the value B, control is made to decrease the gradient Kc1.

Further, similar control is made in regard to the section of the gradient Kc2, the section of the gradient Kc3, and the section of the gradient Kc4. Namely, through feedback control, the gradient Kc2 is changed on a predetermined value-by-value basis in a direction such that a frequency error A' at the top of the section (6th step) in the section having the gradient Kc2 (6th-10th steps) of the triangular wave becomes equal to a frequency error B' at the tail of the section (10th step).

Also, through feedback control, the gradient Kc3 is changed on a predetermined value-by-value basis in a direction such that a frequency error A" at the top of the section (21st step) in the section having the gradient Kc3 (21st-25th steps) of the triangular wave becomes equal to a frequency error B' at the tail of the section (25th step).

Further, through feedback control, the gradient Kc4 is changed on a predetermined value-by-value basis in a direction such that a frequency error A'" at the top of the section (26th step) in the section having the gradient Kc4 (26th-30th steps) of the triangular wave becomes equal to a frequency error B'" at the tail of the section (30th step). Typically, in case that the value A'<the value B', control is made to increase the gradient Kc2, while in case that the value A'>the value B', control is made to decrease the gradient Kc2. Further, in case that the value A"<the value B", control is made to increase the gradient Kc3, while in case that the value A'>the value B', control is made to decrease the gradient Kc3. Also, in case that the value A'"<the value B'", control is made to increase the gradient Kc4, while in case that the value A'">the value B'", control is made to decrease the gradient Kc4.

Additionally, in the third correction method, linearity correction is performed because of approximation of the frequency modulation characteristic by four gradients Kc1, Kc2, Kc3 and Kc4, resulting in the frequency shift errors of +0.9% maximum and −1.7% minimum (an error width of 2.6 points). In comparison with the case of FIG. 8C, the error width is reduced to a small value.

Figure 11A:
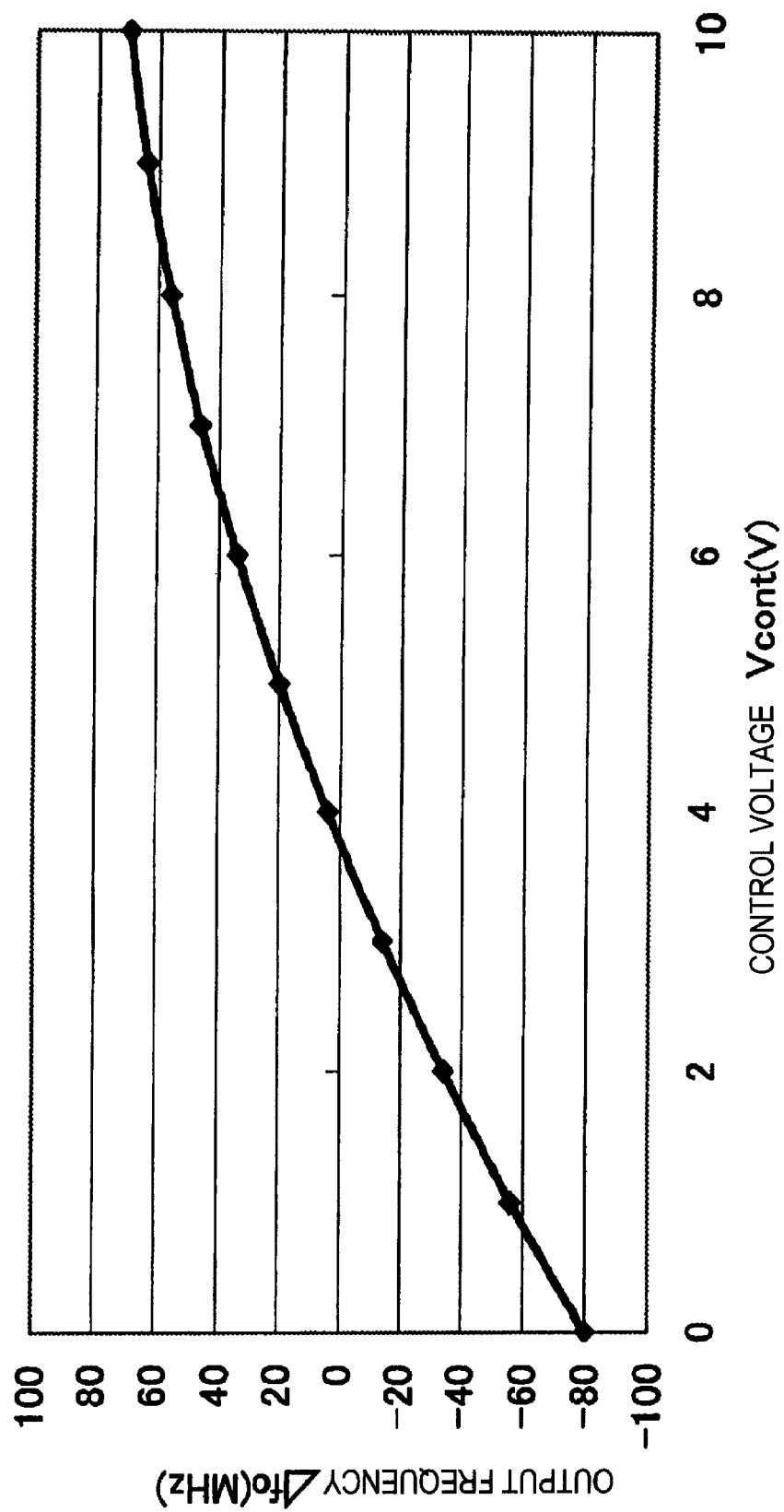
FIG. 11A is a diagram describing a fourth correction method for correcting the center frequency error and the frequency shift error.
Figure 11B:
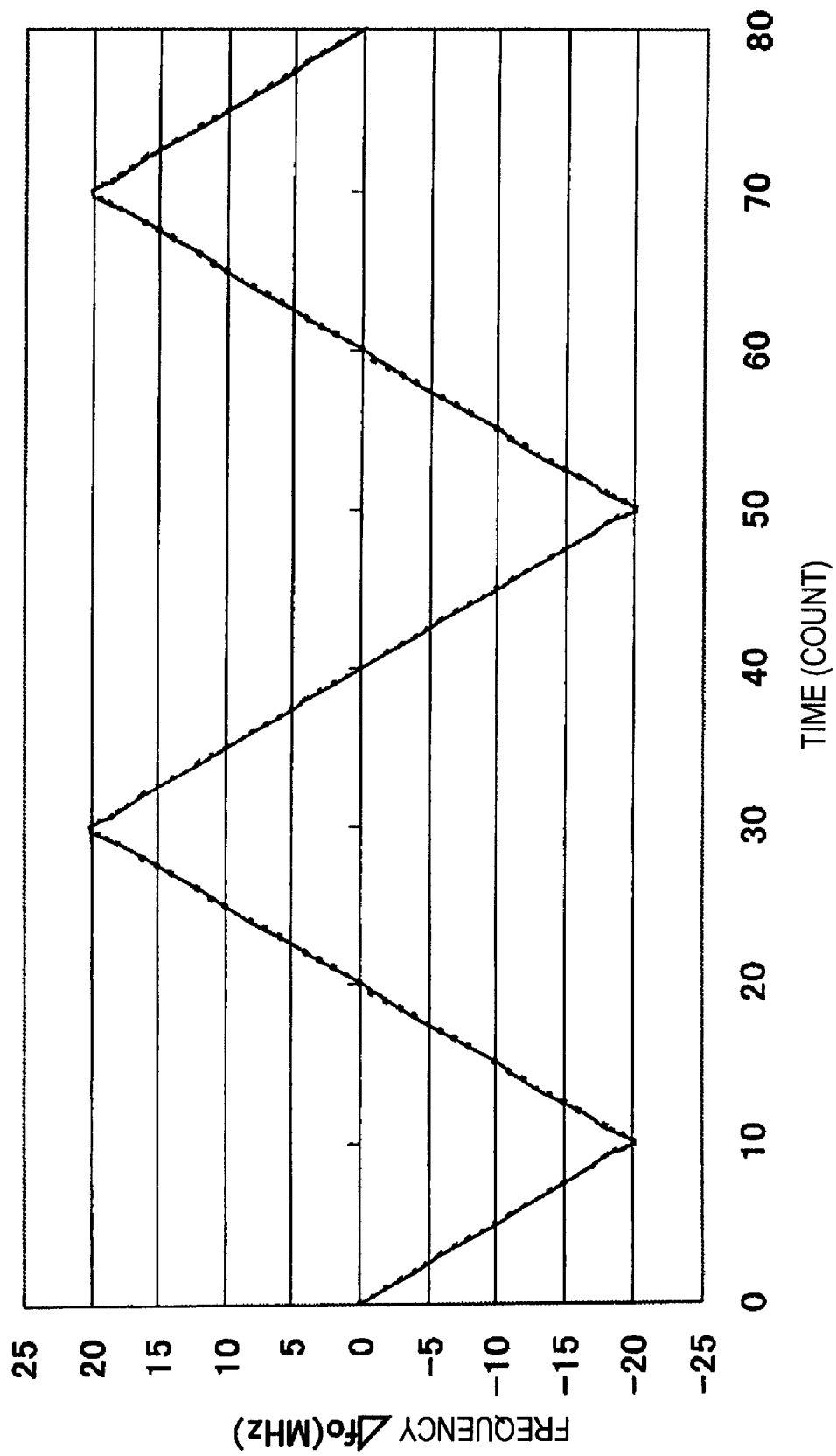
FIG. 11B is a diagram describing a fourth correction method for correcting the center frequency error and the frequency shift error.

FIGS. 11A-11C are diagrams describing a fourth correction method for correcting the center frequency error and the frequency shift error. FIG. 11A is a diagram illustrating an exemplary frequency modulation characteristic of VCO 50, which is identical to FIG. 8A, FIG. 9A and FIG. 10A. Also, FIG. 11B is a diagram illustrating the waveform of the triangular wave, in which the dotted line is the waveform of the reference triangular wave, and the solid line is the waveform of the triangular wave corrected by the fourth correction method. FIG. 11C is a diagram illustrating an exemplary frequency error from the criterion in the fourth correction method.

The fourth correction method does not set the gradient Kc to each section by dividing the triangular wave into the plurality of sections as in the aforementioned second or third correction methods, and instead, corrects the control voltage value output from CPU 43 on a step-by-step basis, based on the detected frequency error (the correction on a step-by-step basis virtually has the same signification as the division on a step-by-step basis). Typically, based on the frequency error in each step, the control is performed on a step-by-step basis to decrease the control voltage value by a predetermined value if the frequency is higher than the criterion (the frequency error has a plus value), and to increase the control value by a predetermined value if the frequency is lower than the criterion (frequency error has a minus value). For example, at the first step, CPU 43 decides the plus/minus of the frequency error difference in the first step, and incase of a plus, increases the control voltage value, being preset for the first step, by a predetermined value and outputs it, while in case of a minus, decreases by a predetermined value and outputs it. Because the correction is performed on a step-by-step basis, it is possible to correct with higher accuracy than in the aforementioned first through third correction methods.

Further, in the fourth correction method, linearity correction is performed because of the correction of the control voltage value on a step-by-step basis, resulting in the frequency shift errors of +1.5% maximum and −1.0% minimum (an error width of 2.5 points). In comparison with the case of FIG. 8C, the error width is reduced to a small value.

In the above description, the detection method and the correction method of the center frequency error and the frequency shift error have been explained. Each process in the above detection method and the correction method can be executed in parallel to the radar operation, without suspension of the radar operation.

Figure 12:
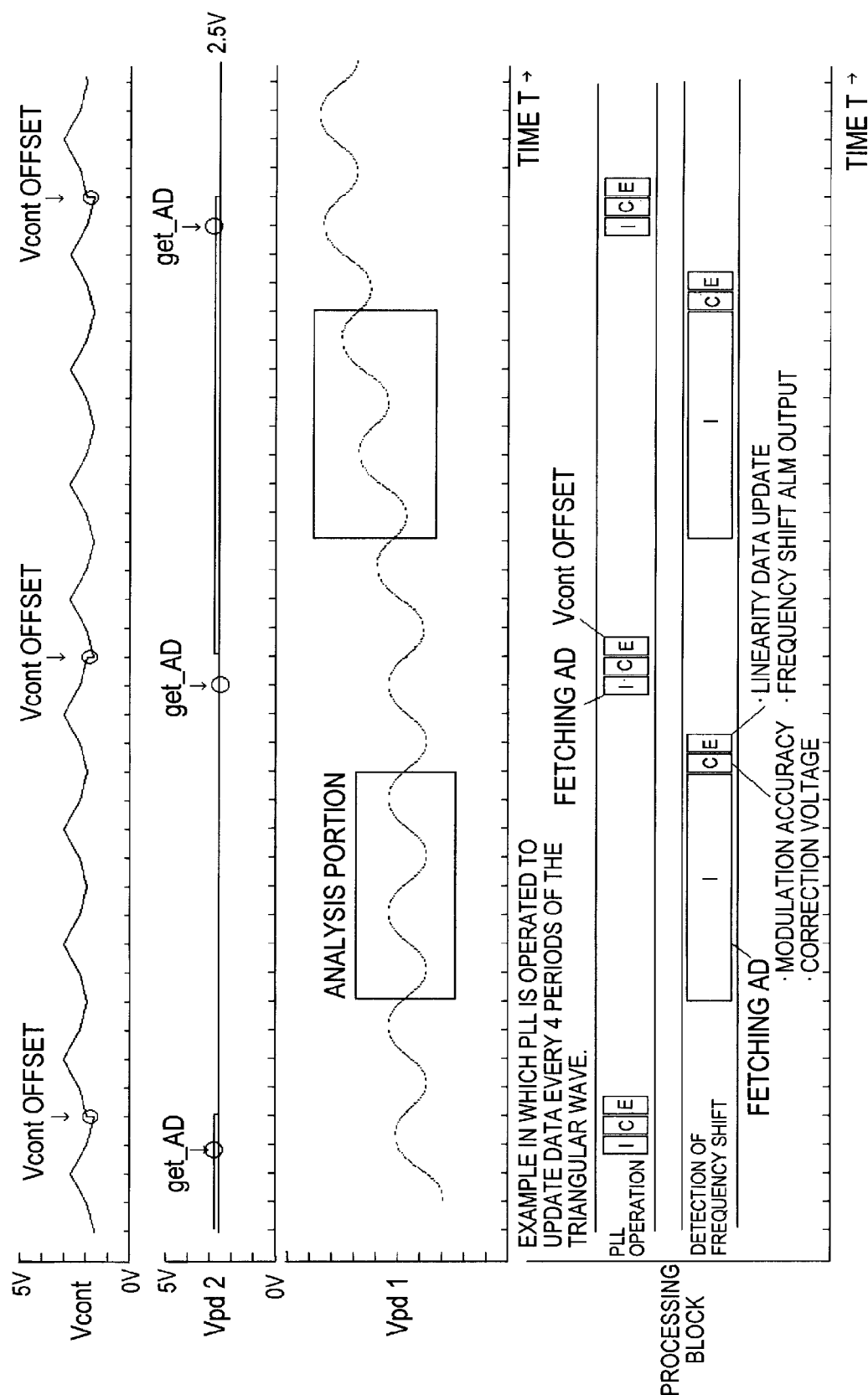
FIG. 12 is a diagram describing the execution timing of the detection method for the center frequency error and the frequency shift error and the correction method therefor.

FIG. 12 is a diagram describing the execution timing of the detection method for the center frequency error and the frequency shift error and the correction method therefor. In FIG. 12, by letting four periods of the triangular wave be one block, there is illustrated an example of performing PLL operation on a block-by-block basis, and detecting and correcting the center frequency error and the frequency shift error in one block. Vcont is a control voltage value, which is triangular-wave modulated. Vpd2 is a phase error signal from LPF 32, and Vpd1 is a phase error signal from LPF 31. The PLL operations are performed every four periods of the triangular waves, and between each PLL operation, there are executed the detection method of the center frequency error and the frequency shift error, and the correction method therefor according to the present invention. Typically, CPU 43 fetches the phase error signals Vpd1 for two periods of the triangular waves in the PLL operation ("input (I)"), detects the center frequency error and the frequency shift error ("calculation(C)"), and based on the detection result, updates the correction values of various types of parameters, such as the control voltage Vc_center for the center frequency and the gradient Kc ("execution (E)"), and then, based on the update result, CPU 43 outputs the control voltage value.

When the frequency shift error exceeds a predetermined tolerable range, it may also be possible to configure to output an alarm. As an example, the tolerable range is ±2% of the frequency error or less. When the frequency shift error exceeds a predetermined tolerable range, a case of impossible correction even by means of feedback control is assumed, and accordingly, CPU 43 may be configured to suspend the radar operation as well as to output the alarm signal. This is particularly effective when a discontinuous change such as a frequency jump occurs in VCO.

Further, in the above description, the control voltage value Vc_center corresponding to the center frequency is controlled so that the average frequency C of the frequency error becomes the offset value 0. Here, by modifying the above offset value, it is possible to perform modification (fine tuning) of the center frequency. For frequency modification, generally it is necessary to modify the number of frequency divisions in the frequency divider, and however, according to the present invention, it is possible to modify the center frequency also, while the correction of the center frequency is being performed, without modifying the number of frequency divisions in the frequency divider.

Figure 13:
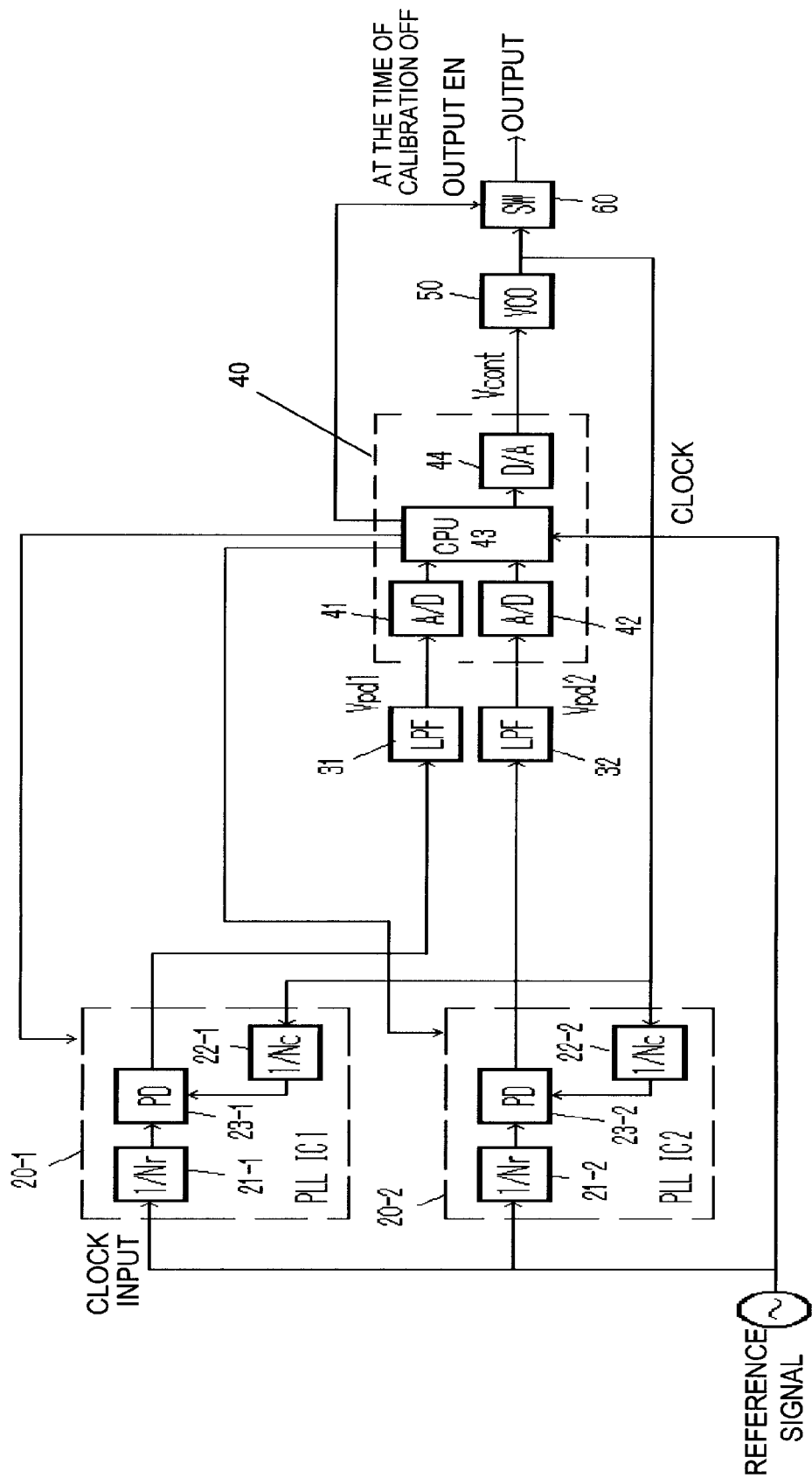
FIG. 13 is a diagram illustrating a second exemplary configuration of a phase locked oscillator according to an embodiment of the present invention.

FIG. 13 is a diagram illustrating a second exemplary configuration of a phase locked oscillator according to an embodiment of the present invention. In comparison with the first configuration illustrated in FIG. 4, the second exemplary configuration includes two phase comparator units 20. A phase detector (PD) 23-1 in a phase comparator unit 20-1 outputs a phase error signal (phase error voltage) to a low pass filter (LPF) 32 for PLL loop. Also, a phase detector (PD) 23-2 in a phase comparator unit 20-2 outputs a phase error signal to a low pass filter (LPF) 31 for frequency error detection in accordance with the present invention. In the phase detector (PD), the comparison frequency is proportional to a phase error sensitivity. Therefore, by employing two phase comparator units respectively for PLL loop and for frequency error detection, and by setting the number of frequency divisions independently and by setting the comparison frequencies, it is possible to independently set the phase error sensitivities optimal for the respective uses thereof.

By letting the VCO oscillation frequency corresponding to the reference triangular wave as 2.5 GHz, the frequency shift as 10 MHz and the triangular wave period as 100 Hz, a phase change in a sine wave shape being output from the phase detector (PD) comes to be 10 μs in width. By multiplying the above phase change by the phase error sensitivity (V/rad) of the phase detector (PD), a phase error voltage, which is an output of the phase detector (PD), is obtained. Since the phase detector (PD) outputs phase changes relative to the comparison frequencies, even when the phase change amount is identical, the phase error sensitivity (V/rad) differs depending on the comparison frequency. Therefore, it is possible to change the phase error sensitivity by changing the comparison frequency by the combination of the divided frequencies. Accordingly, it is possible to change the phase error sensitivities of the phase detectors (PD) 23-1 and 23-2 by changing the number of divided frequencies in the frequency dividers 21-1, 22-1 of the phase comparator unit 20-1 and the number of divided frequencies in the frequency dividers 21-2, 22-2 of the phase comparator unit 20-2. To achieve the above function, it is possible to independently set optimal phase error sensitivities.

Figure 14:
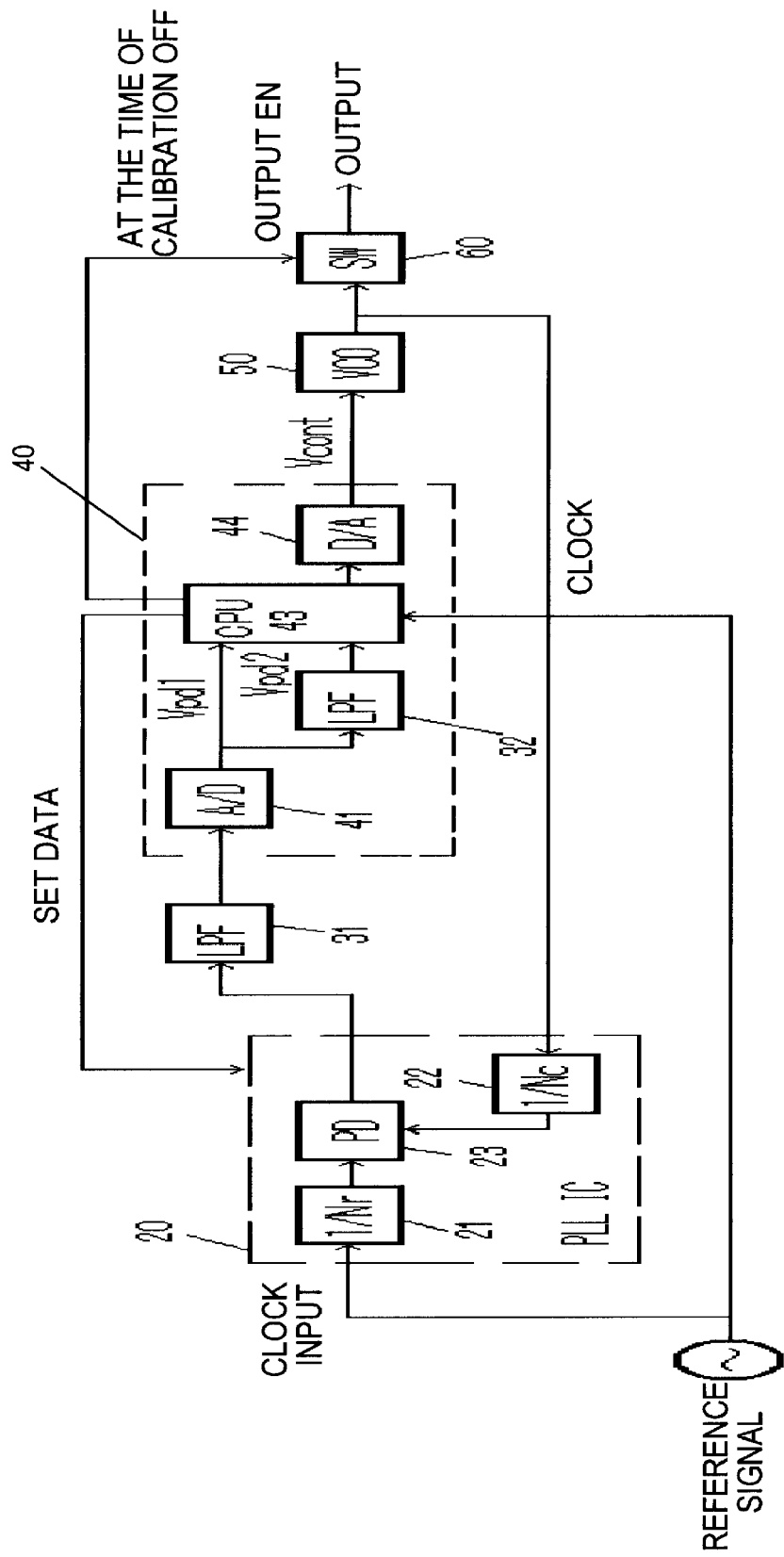
FIG. 14 is a diagram illustrating a third exemplary configuration of a phase locked oscillator according to an embodiment of the present invention.

FIG. 14 is a diagram illustrating a third exemplary configuration of a phase locked oscillator according to an embodiment of the present invention. In comparison with the first configuration illustrated in FIG. 4, the third exemplarily configuration includes a low pass filter (LPF) 32 configured of a digital filter. By configuring the low pass filter (LPF) 32 using the digital filter, it is possible to configure using a single A/D 41 only by omitting A/D 42. Here, the example of configuring using the digital low pass filter (LPF) is illustrated, and however, it may be possible to configure using a digital phase detector (DPD) for counting time intervals. As to the phase detector (PD) and the low pass filter (LPF), either digital or analog configuration may be applicable.

The aforementioned embodiments of the present invention have been described by using the exemplary application to the FM-CW radar. However, the application of the present invention is not limited to the FM-CW radar, and it is possible to apply to a radar of another system (two-frequency CW radar, for example). In case of application to the two-frequency CW radar, the frequency error can be detected by comparing with a reference phase change and by calculating a phase error in each step. Then, a frequency error amount can be obtained by differentiating the above phase error. Hereafter, an example of detecting the center frequency error and the frequency shift error in the two-frequency CW radar will be described as an example 4, which corresponds to the example 3 explained by using FIGS. 7A-7E as the detection example of the center frequency error and the frequency shift error in the FM-CW radar.

FIGS. 15A-15E are diagrams describing the example 4. Similar to the example 3, the example 4 is a case that the center frequency of the VCO output frequency is 1 MHz higher, and also the frequency shift is 1.0 MHz smaller, in comparison with the criterion. Now, there will be described a method for deriving through calculation that the center frequency is 1 MHz higher and the frequency shift is 1.0 MHz smaller. A reference output frequency has a waveform illustrated by the dotted line in FIG. 15A. In contrast, a waveform in which a center frequency is 1 MHz higher than the reference output frequency and a frequency shift is 1.0 MHz smaller is illustrated by the solid line in FIG. 15A.

FIG. 15B illustrates the output (error voltage signal) of the phase detector corresponding to the dotted line and the solid line illustrated in FIG. 15A. The waveform illustrated by the dotted line in FIG. 15B is the error voltage signal of the phase detector when the VCO output frequency is identical to the criterion, while the waveform illustrated by the solid line in FIG. 15B is the error voltage signal of the phase detector when the center frequency of the output frequency is 1 MHz higher and the frequency shift is 1.0 MHz smaller. Namely, when the center frequency of the output frequency is 1 MHz higher and the frequency shift is 1.0 MHz smaller, the phase difference between with the reference frequency is spreading. Therefore, the output value is gradually increasing with a change in a triangular wave shape, and thus the difference between with the reference output value is increasing. Also, because the phase change between with the reference frequency is smaller in comparison with the criterion, the amplitude of the triangular wave becomes smaller in comparison with the case of the criterion.

Figure 15C:
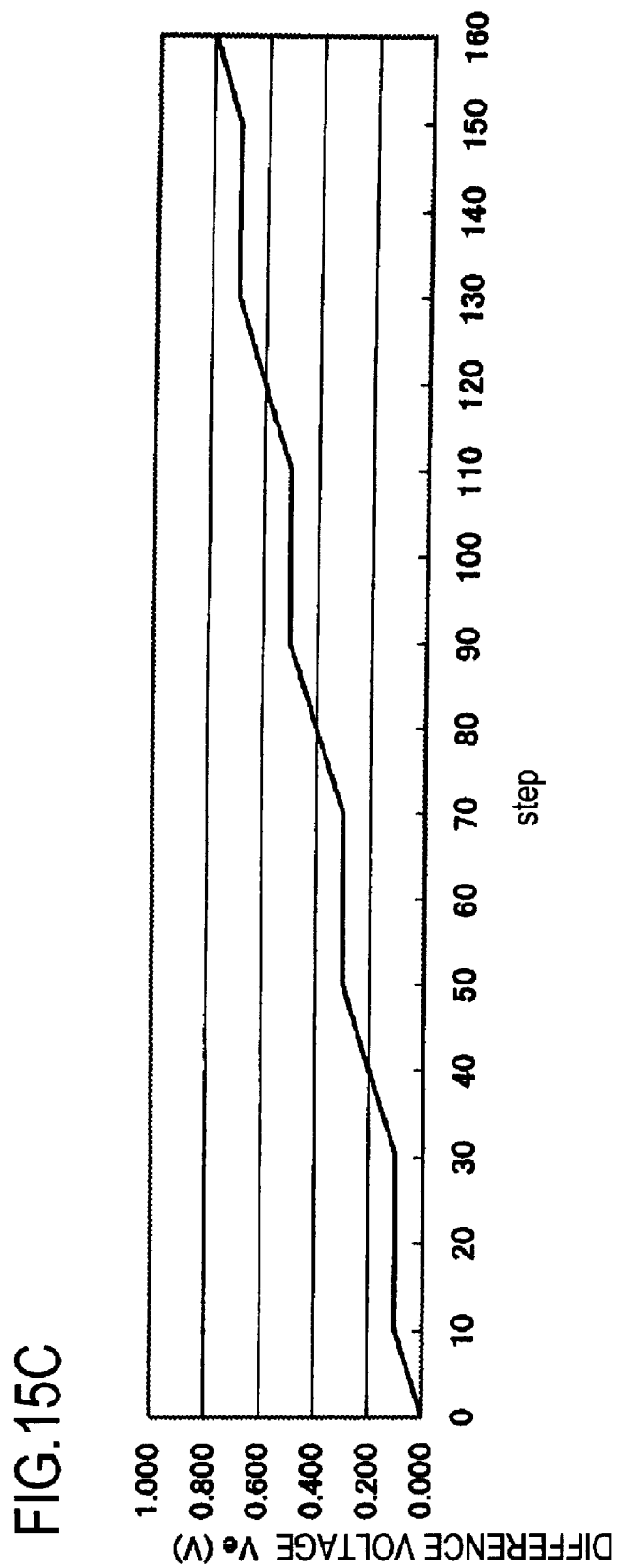
FIG. 15C is a diagram describing an example (example 4) in a case of calculating central frequency error and frequency shift error of the VCO output frequency in a two-frequency CW radar.

FIG. 15C illustrates a difference between the waveforms illustrated by the dotted line and the solid line in FIG. 15B, representing a difference of the error voltage signal from the criterion when the center frequency of the VCO output frequency is 1 MHz higher and the frequency shift is 1.0 MHz smaller. It is understood from FIG. 15C that, while the difference changes periodically in a triangular wave shape, the magnitude thereof is gradually increasing.

FIG. 15D illustrates a result of differentiating the difference value obtained in FIG. 15C. The differentiation calculation method is that a change (differentiated value) Ve'(n) of the error voltage (Ve) is obtained, similar to the case of the example 3. Because the phase difference is periodically changing in a triangular wave shape, and also the difference value is increasing (FIG. 15C), the change (differentiated value) of the error voltage periodically changes in a rectangular wave shape according to the section between the upper limit frequency and the lower limit frequency, with the center frequency thereof deviating by a constant value (0.005 V).

After obtaining the change (differentiated value) of the error voltage, the obtained differentiated value is converted into a frequency change $\Delta f(n)$, by use of a sensitivity Kd (V/Hz) of the phase detector.

Figure 15E:
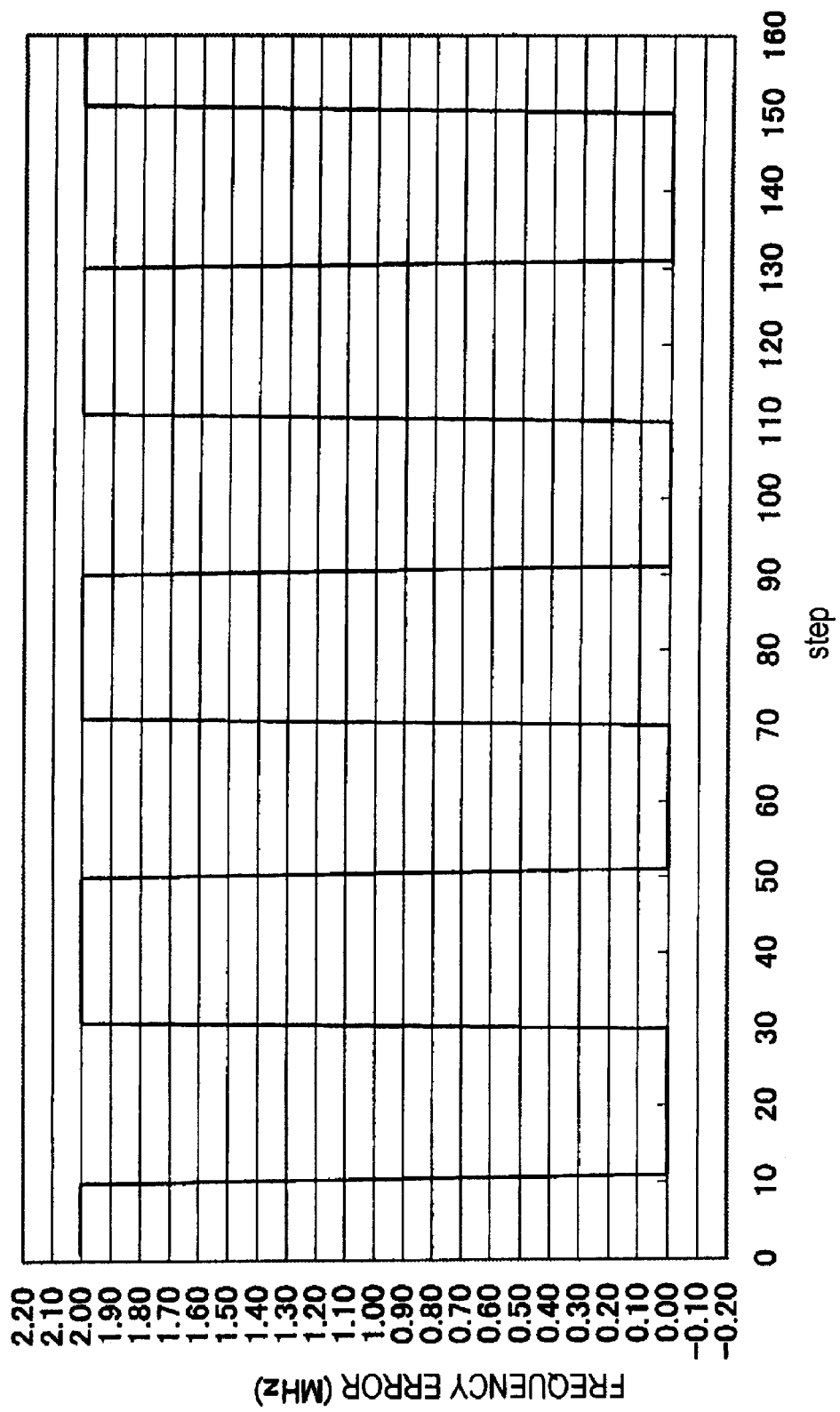
FIG. 15E is a diagram describing an example (example 4) in a case of calculating central frequency error and frequency shift error of the VCO output frequency in a two-frequency CW radar.

FIG. 15E illustrates a frequency change in the case of the example 4. In comparison with the criterion, the VCO output frequency has an error of +1 MHz in a center frequency portion, and the frequency shift deviates by +1 MHz. Accordingly, it is understood that the center frequency of the VCO output frequency is 1 MHz higher and the frequency shift is 1.0 MHz smaller. As such, by comparing the output (FIG. 15B) of the phase detector with the criterion, and by obtaining the difference therebetween, it is possible to detect both a center frequency error and a frequency shift error from the differentiation result of the above difference. Further, also in the case of the two-frequency CW radar, it is possible to obtain the control voltage correction amount $\Delta V_{cont}$ corresponding to the frequency error amount, similar to the case of the FM-CW radar. As such, in regard to the two-frequency radar, it is possible to detect the center frequency error and the frequency shift error of the VCO output frequency, similar to the case of the FM-CW radar.

By the aforementioned embodiments, it is possible to detect and correct real time the center frequency error and the frequency shift error without suspending the radar operation. By this, it becomes possible to achieve the improvement of accuracy and the prevention of malfunction in the radar operation, contributing to the improvement of reliability. Further, an efficient use of frequency bands can be achieved, enabling the increase of the number of channels. Moreover, because the frequency is corrected during the radar operation at appropriate times, VCO can be designed with drastic mitigation of temperature characteristic and aging standards in regard to linearity and modulation sensitivity.

Although the preferred embodiments of the present invention are described above, the protective scope of the present invention covers the inventions defined in the claims and their equivalents, but is not limited to the above embodiments.

INDUSTRIAL APPLICABILITY

The present invention is applicable that an FM-CW radar is mounted on, for example, an automobile, so as to be applied to such functions as collision prevention and inter-vehicle distance control.

What is claimed is:
1. A phase locked oscillator comprising:
a first phase detector comparing between phases of a reference signal and a first comparison signal, and outputting a phase error signal corresponding to a phase difference;
a first low pass filter cutting off an alternating current component of the phase error signal of the first phase detector;
a control unit controlling a control voltage according to an output signal from the first low pass filter, and outputting the control voltage for each predetermined control step;
a voltage control led oscillator generating a frequency modulated signal having a frequency changing from a predetermined center frequency by a predetermined frequency shift amount at a predetermined period according to the control voltage; and a first variable frequency divider forming the first comparison signal by frequency dividing the frequency modulated signal of the voltage controlled oscillator, the control unit further comprising:

an error detection unit for detecting a frequency error of the frequency modulated signal for each control step relative to a reference frequency modulated signal modulated with a preset reference center frequency and a reference frequency shift based on the phase error signal; and a correction unit for correcting the control voltage based on the detected frequency error.

2. The phase locked oscillator according to claim 1, wherein the error detection unit obtains a difference between a reference phase error signal being output from the phase detector when the reference frequency modulated signal is output from the voltage controlled oscillator and the phase error signal actually output from the phase detector, and further detects the frequency error of the frequency modulated signal based on a change rate of the difference.

3. The phase locked oscillator according to claim 2, wherein the correction unit calculates an average value of the frequency errors in a predetermined section of the frequency modulated signal, and corrects a control voltage in such a manner that the average value becomes a predetermined offset value.

4. The phase locked oscillator according to claim 3, wherein the correction unit corrects the center frequency of the frequency modulated signal by setting the offset value to be zero.

5. The phase locked oscillator according to claim 3, wherein the correction unit allows the center frequency of the frequency modulated signal to change without changing the number of frequency divisions of the variable divider, by setting the offset value to be a predetermined value other than zero.

6. The phase locked oscillator according to claim 2, wherein the correction unit corrects the frequency shift of the frequency modulated signal by changing the change rate of the control voltage for each control step, based on the comparison of at least two frequency errors in one period of the frequency modulated signal.

7. The phase locked oscillator according to claim 6, wherein the correction unit allows the change rate of the control voltage for each control step to change in such a manner that an average value of a maximum value and a minimum value of the frequency errors in a first section in one period of the frequency modulated signal becomes equal to an average value of a maximum value and a minimum value of the frequency errors in a second section.

8. The phase locked oscillator according to claim 6, wherein the correction unit allows the change rate of the control voltage for each control step in the first section to change in such a manner that predetermined two frequency errors included in the first section in one period of the frequency modulated signal become equal, and allows the change rate of the control voltage for each control step in the second section to change in such a manner that predetermined two frequency errors included in the second section in one period of the frequency modulated signal become equal.

9. The phase locked oscillator according to claim 6, wherein the correction unit allows a control voltage being output according to the change rate of the control voltage for each control step to change on the basis of each control step, based on the frequency error of the frequency modulated signal for each control step.

10. The phase locked oscillator according to claim 2, wherein the correction unit calculates a correction value of the control voltage corresponding to the frequency error, according to modulation sensitivity of the voltage controlled oscillator corresponding to the frequency change rate of the frequency modulated signal corresponding to the change rate of the control voltage, and corrects the control voltage using the correction value.

11. The phase locked oscillator according to claim 2, wherein the control unit further decides whether the frequency error exceeds a predetermined tolerable range, and in case of an excess, includes an alarm unit for suspending outputting the frequency modulated signal from the voltage controlled oscillator.

12. The phase locked oscillator according to claim 1, further comprising:

a second low pass filter passing a frequency component in the phase error signal corresponding to the predetermined period of the frequency modulated signal, wherein an output signal of the second low pass filter is input to the control unit, and wherein the error detection unit detects the frequency error based on the output signal of the second low pass filter.

13. The phase locked oscillator according to claim 1, further comprising:

a second phase detector comparing between phases of the reference signal and a second comparison signal, and outputting a phase error signal according to a phase difference;

a second variable frequency divider forming the second comparison signal by frequency dividing the frequency modulated signal of the voltage controlled oscillator by the number of frequency divisions different from the number of frequency divisions of the first variable frequency divider; and a second low pass filter passing a frequency component in the phase error signal from the second phase detector, corresponding to the predetermined period of the frequency modulated signal, wherein an output signal of the second low pass filter is input to the control unit, and wherein the error detection unit detects the frequency error based on the output signal of the second low pass filter.

14. A radar unit comprising the phase locked oscillator claimed in claim 1.

15. The radar unit according to claim 14, wherein the radar unit is an FM-CW radar or a two-frequency CW radar.

* * * * *